US012751010B2

(12) United States Patent
Park et al.

(10) Patent No.: US 12,751,010 B2
(45) Date of Patent: Sep. 29, 2026

(54) SEMICONDUCTOR DEVICE, ELECTRONIC SYSTEM INCLUDING THE SAME, AND METHOD OF FABRICATING THE SAME

(71) Applicant: SAMSUNG ELECTRONICS CO., LTD., Suwon-si (KR)

(72) Inventors: Yejin Park, Suwon-si (KR); Seung Yoon Kim, Suwon-si (KR); Heesuk Kim, Suwon-si (KR); Hyeongjin Kim, Suwon-si (KR); Sehee Jang, Suwon-si (KR); Minsoo Shin, Suwon-si (KR); Seungjun Shin, Suwon-si (KR); Sanghun Chun, Suwon-si (KR); Jeehoon Han, Suwon-si (KR); Jae-Hwang Sim, Suwon-si (KR); Jongseon Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 473 days.

(21) Appl. No.: 18/208,459

(22) Filed: Jun. 12, 2023

(65) Prior Publication Data

US 2024/0130123 A1 Apr. 18, 2024

(30) Foreign Application Priority Data

Oct. 13, 2022 (KR) ........................ 10-2022-0131413

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02);
(Continued)

(58) Field of Classification Search
CPC ................................ H10B 41/27; H10B 43/27
See application file for complete search history.

(56) References Cited

U.S. PATENT DOCUMENTS 9,570,463 B1 * 2/2017 Zhang .................... H10B 43/50
10,163,924 B2 12/2018 Ahn
(Continued)

FOREIGN PATENT DOCUMENTS

KR 10-2017-0142774 A 12/2017
KR 20220057896 A 5/2022
KR 20220099039 A 7/2022

*Primary Examiner* — Evren Seven
(74) *Attorney, Agent, or Firm* — Muir Patent Law, PLLC

(57) ABSTRACT

Disclosed are semiconductor devices, electronic systems including the same, and methods of fabricating the same. The semiconductor device comprises a first gate stack structure including a first dielectric pattern and a first conductive pattern that are alternately stacked with each other, a memory channel structure including a first memory portion that penetrates the first gate stack structure, a through contact including a first through portion at a level the same as a level of the first memory portion, and a connection contact including a first connection portion at a level the same as the level of the first memory portion and the level of the first through portion. A minimum width of the first memory portion is less than a minimum width of the first through portion and a minimum width of the first connection portion.

20 Claims, 33 Drawing Sheets

(51) Int. Cl.

| | |
|---|---|
| ***H10B 41/27*** | (2023.01) |
| ***H10B 41/35*** | (2023.01) |
| ***H10B 43/10*** | (2023.01) |
| ***H10B 43/35*** | (2023.01) |
| ***H10B 80/00*** | (2026.01) |
| ***H10W 20/41*** | (2026.01) |
| ***H10W 20/42*** | (2026.01) |
| ***H10W 90/00*** | (2026.01) |
| ***H10W 90/20*** | (2026.01) |

(52) U.S. Cl.

CPC ............. *H10B 43/10* (2023.02); *H10B 43/35* (2023.02); *H10B 80/00* (2023.02); *H10W 20/42* (2026.01); *H10W 20/435* (2026.01); *H10W 90/00* (2026.01); *H10W 90/297* (2026.01)

(56) References Cited

U.S. PATENT DOCUMENTS 10,553,609 B2 * 2/2020 Lee ..................... H01L 23/5226
10,636,806 B2 4/2020 Lee
12,127,410 B2 * 10/2024 Rabkin ................ H10D 64/689
2010/0109071 A1 * 5/2010 Tanaka ................... H10B 43/27 257/324
2011/0065270 A1 * 3/2011 Shim .................... H10D 30/693 257/E21.613
2011/0151667 A1 * 6/2011 Hwang .................. H10B 41/27 257/E21.585
2015/0179660 A1 * 6/2015 Yada .................... H10D 64/035 257/314
2016/0005760 A1 * 1/2016 Lee ........................ H10B 43/27 257/324
2017/0062462 A1 * 3/2017 Lee ........................ H10B 43/27
2017/0110470 A1 * 4/2017 Rabkin ................ H10D 64/661
2017/0365616 A1 * 12/2017 Kang ..................... H10D 62/83
2018/0330948 A1 * 11/2018 Kwon .................... H10B 43/27
2019/0378852 A1 * 12/2019 Baek ................... H01L 23/5226
2020/0098786 A1 * 3/2020 Park ...................... H01L 23/481
2020/0119038 A1 * 4/2020 Hopkins ................ H10B 43/27
2021/0091101 A1 3/2021 Noda et al.
2021/0210503 A1 * 7/2021 Matsuno ........... H01L 21/76877
2021/0287986 A1 * 9/2021 Gwon .................. H10D 62/235
2021/0296344 A1 9/2021 Kim
2021/0313341 A1 * 10/2021 Kang ..................... H10B 43/40
2022/0085044 A1 * 3/2022 Xia ....................... H01L 23/528
2022/0139831 A1 5/2022 Kim et al.
2022/0231038 A1 * 7/2022 Baek ...................... H10B 41/27
2022/0399369 A1 * 12/2022 Son ........................ H10B 41/10

* cited by examiner

SEMICONDUCTOR DEVICE, ELECTRONIC SYSTEM INCLUDING THE SAME, AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0131413 filed on Oct. 13, 2022 in the Korean Intellectual Property Office, the disclosure of which is hereby incorporated by reference in its entirety.

BACKGROUND

1. Field

Some embodiments relate to a semiconductor device and an electronic system including the same, and more particularly, to a semiconductor device including a through contact and an electronic system including the same.

2. Description of the Related Art

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements.

Recently, high speed and low consumption of electronic products require that semiconductor devices embedded in the electronic products should have high operating speed and/or lower operating voltage. However, an increase in integration of semiconductor devices may cause a reduction in electrical properties and production yield of semiconductor devices. Therefore, many studies have been conducted to increase electrical properties and production yield of semiconductor devices.

SUMMARY

Some embodiments provide a semiconductor device with improved reliability and electrical properties and an electronic system including the same.

According to some embodiments, a semiconductor device may include a first gate stack structure including a first dielectric pattern and a first conductive pattern that are alternately stacked with each other; a memory channel structure including a first memory portion that penetrates the first gate stack structure; a through contact including a first through portion at a level that is the same as a level of the first memory portion; and a connection contact including a first connection portion at a level that is the same as the level of the first memory portion and the level of the first through portion. A minimum width of the first memory portion may be less than a minimum width of the first through portion and a minimum width of the first connection portion.

According to some embodiments, a semiconductor device may include a first gate stack structure including a first dielectric pattern and a first conductive pattern that are alternately stacked with each other; a second gate stack structure below the first gate stack structure, the second gate stack structure including a second dielectric pattern and a second conductive pattern that are alternately stacked with each other; a memory channel structure including a first memory portion that penetrates the first gate stack structure and a second memory portion that penetrates the second gate stack structure; and a through contact including a first through portion at a level the same as a level of the first memory portion and a second through portion at a level the same as a level of the second memory portion. The first through portion may include a first through curved surface connected to the second through portion. A distance between facing segments of the first through curved surface may increase as a level of the first through curved surface becomes lower.

According to some embodiments, an electronic system may include a main board; a semiconductor device on the main board; and a controller on the main board and electrically connected to the semiconductor device. The semiconductor device may include: a first gate stack structure including a first dielectric pattern and a first conductive pattern that are alternately stacked with each other; a memory channel structure including a first memory portion that penetrates the first gate stack structure; a through contact including a first through portion at a level the same as a level of the first memory portion; a connection contact including a first connection portion at a level the same as the level of the first memory portion and the level of the first through portion; and a support structure including a first support portion at a level the same as the level of the first through portion and the level of the first connection portion. A minimum width of the first memory portion may be less than a minimum width of the first through portion, a minimum width of the first connection portion, and a minimum width of the first support portion. A level of an uppermost portion of the memory channel structure may be lower than a level of an uppermost portion of the support structure. The level of the uppermost portion of the support structure may be lower than a level of an uppermost portion of the through contact and a level of an uppermost portion of the connection contact.

According to some embodiments, a method of fabricating a semiconductor device may include forming a first stack structure including a first dielectric layer and a first sacrificial layer that are alternately stacked with each other; patterning the first dielectric layer and the first sacrificial layer to form a first stack stepwise structure of the first stack structure; forming a first stepwise dielectric material that covers the first stack stepwise structure of the first stack structure; forming a channel hole that penetrates the first stack structure, a through hole that penetrates the first stack structure, and a connection hole that penetrates the first stepwise dielectric layer; forming a memory channel structure in the channel hole; expanding the through hole and the connection hole; and forming a through contact and a connection contact.

BRIEF DESCRIPTION OF THE DRAWINGS

Features will become apparent to those of skill in the art by describing in detail exemplary embodiments with reference to the attached drawings in which.

DETAILED DESCRIPTION

The following will describe a semiconductor device and a method of fabricating the same according to some embodiments in conjunction with the accompanying drawings.

Figure 1A:
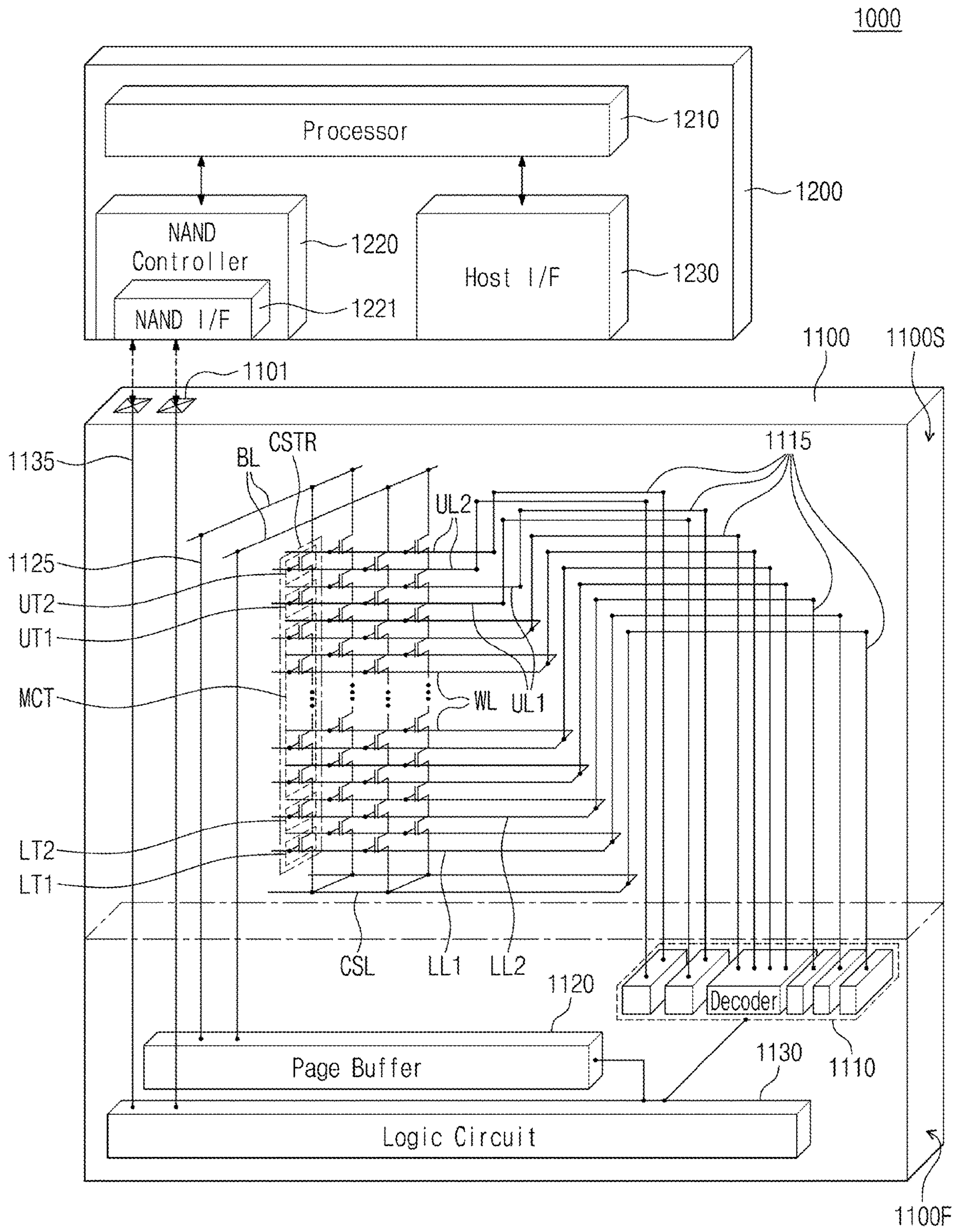
FIG. 1A illustrates a simplified block diagram showing an electronic system including a semiconductor device according to some embodiments.

FIG. 1A illustrates a simplified block diagram showing an electronic system including a semiconductor device according to some embodiments.

Referring to FIG. 1A, an electronic system 1000 according to some embodiments may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, such as a NAND Flash memory device. The semiconductor device 1100 may include a first structure 1100F and a second structure 1100S on the first structure 1100F. In some embodiments, the first structure 1100F may be disposed on one side of the second structure 1100S. The first structure 1100F may be a peripheral circuit region that includes a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between the bit line BL and the common source line CSL.

On the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and of the upper transistors UT1 and UT2 may be variously changed in accordance with embodiments.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F to the second structure 1100S. The bit lines BL may be electrically connected to the page buffer 1120 through second connection lines 1125 that extend from the first structure 1100F to the second structure 1100S.

On the first structure 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F to the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control an overall operation of the electronic system 1000 that includes the controller 1200. The processor 1210 may operate based on predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer therethrough a control command to control the semiconductor device 1100, data intended to be written on the memory cell transistors MCT of the semiconductor device 1100, and/or data intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1210 in response to the control command.

Figure 1B:
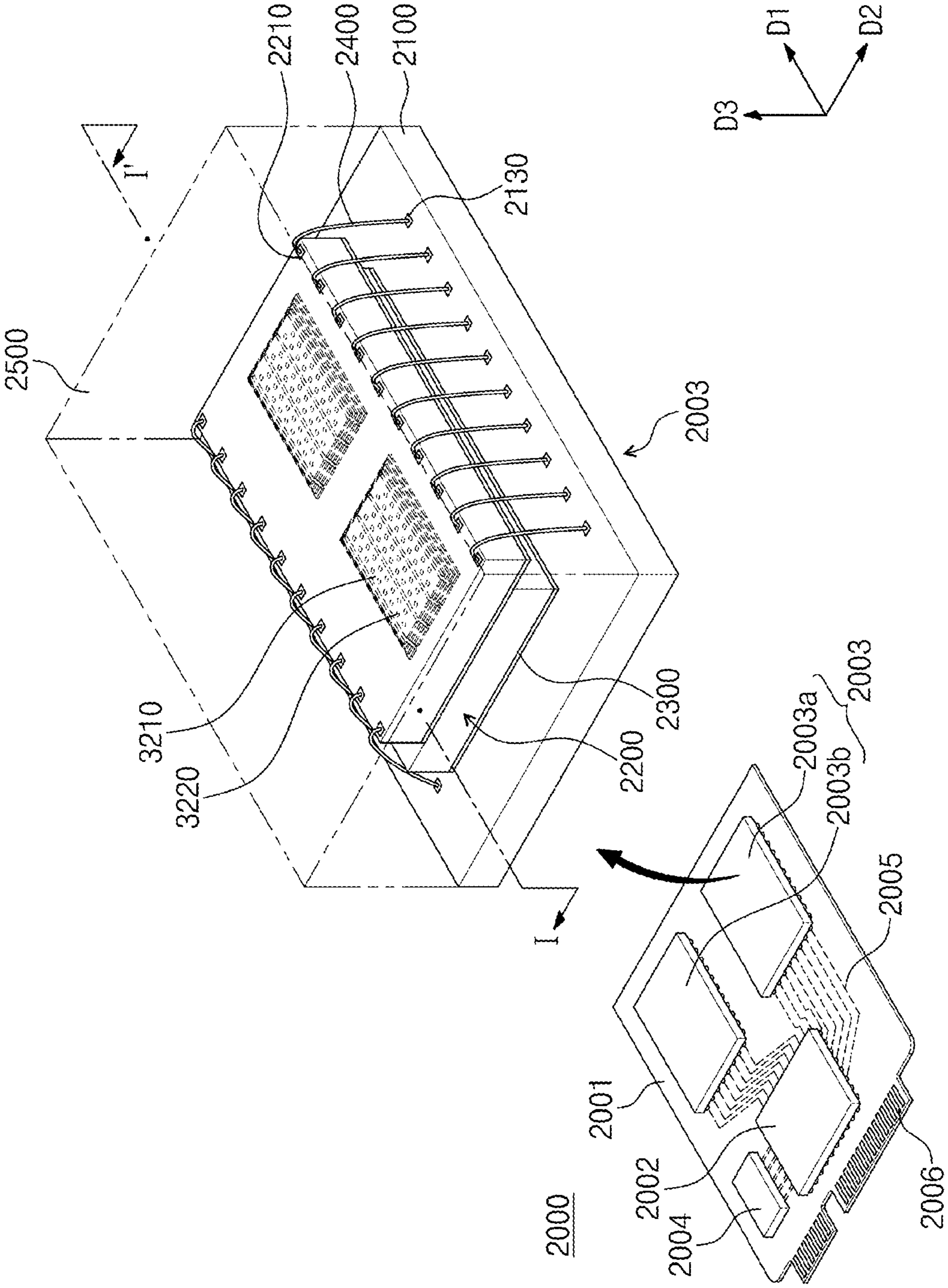
FIG. 1B illustrates a simplified perspective view showing an electronic system including a semiconductor device according to some embodiments.

FIG. 1B illustrates a simplified perspective view showing an electronic system including a semiconductor device according to some embodiments.

Referring to FIG. 1B, an electronic system 2000 according to some example embodiments may include a main board 2001, a controller 2002 mounted on the main board 2001, at least one semiconductor package 2003, and a dynamic random access memory (DRAM) 2004. The semiconductor package 2003 and the DRAM 2004 may be connected to the controller 2002 through wiring patterns 2005 formed on the main board 2001.

The main board 2001 may include a connector 2006 including a plurality of pins which can be connected to an external host. The number and arrangement of the plurality of pins on the connector 2006 may be changeable based on a communication interface between the electronic system 2000 and the external host. In some embodiments, the electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). In some embodiments, the electronic system 2000 may operate with power supplied through the connector 2006 from an external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between an external host and the semiconductor package 2003 that serves as a data storage space. The DRAM 2004 included in the electronic system 2000 may operate as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but also a DRAM controller for controlling the DRAM 2004.

The semiconductor package 2003 may include first and second semiconductor packages **2003*a* and 2003*b* that are spaced apart from each other. Each of the first and second semiconductor packages 2003*a* and 2003*b* may be a semiconductor package including a plurality of semiconductor chips 2200. Each of the first and second semiconductor package 2003*a* and 2003*b* may include a package substrate 2100, semiconductor chips 2200 on the package substrate 2100, adhesion layers 2300 on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400**.

The package substrate 2100 may be an integrated circuit board including package upper pads 2130. Each of the semiconductor chips 2200 may include one or more input/output pads 2210. The input/output pad 2210 may correspond to the input/output pad 1101 of FIG. 1A. Each of the semiconductor chips 2200 may include gate stack structures 3210 and memory channel structures 3220. Each of the semiconductor chips 2200 may include a semiconductor device which will be discussed below.

In some embodiments, the connection structures 2400 may be bonding wires that electrically connect the input/output pads 2210 to the package upper pads 2130. Therefore, on each of the first and second semiconductor packages **2003*a* and 2003*b*, the semiconductor chips 2200 may be electrically connected to each other in a wire bonding manner, and may be electrically connected to the package upper pads 2130 of the package substrate 2100. In some embodiments, on each of the first and second semiconductor packages 2003*a* and 2003*b*, the semiconductor chips 2200 may be electrically connected to each other using through-silicon vias (TSVs) instead of the connection structures 2400** or the bonding wires.

In some embodiments, the controller 2002 and the semiconductor chips 2200 may be included in one package. In some embodiments, the controller 2002 and the semiconductor chips 2200 may be mounted on a separate interposer substrate other than the main board 2001, and may be connected to each other through wiring lines provided in the interposer substrate.

Figure 1C:
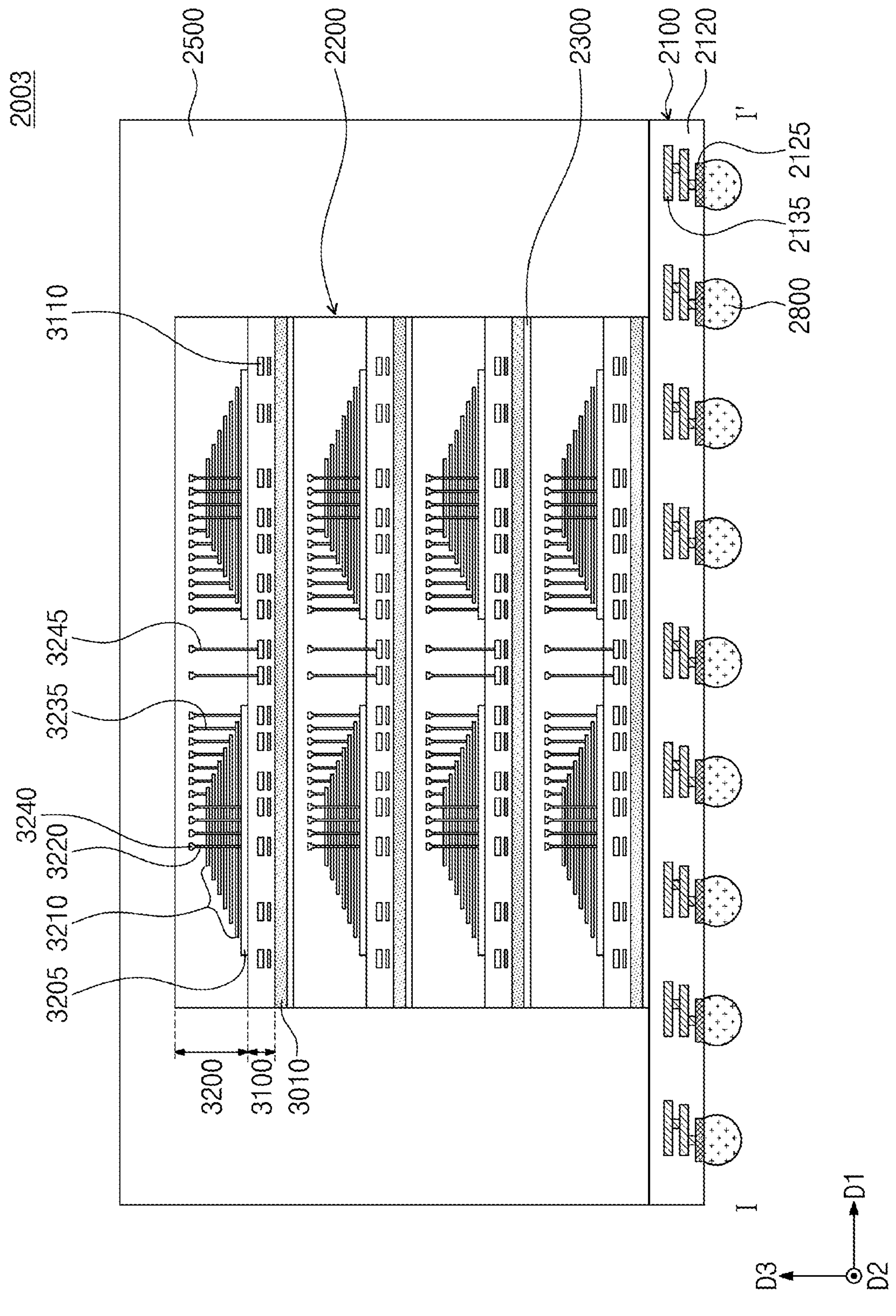
FIGS. 1C and 1D illustrate simplified cross-sectional views showing a semiconductor package according to some embodiments.
Figure 1D:
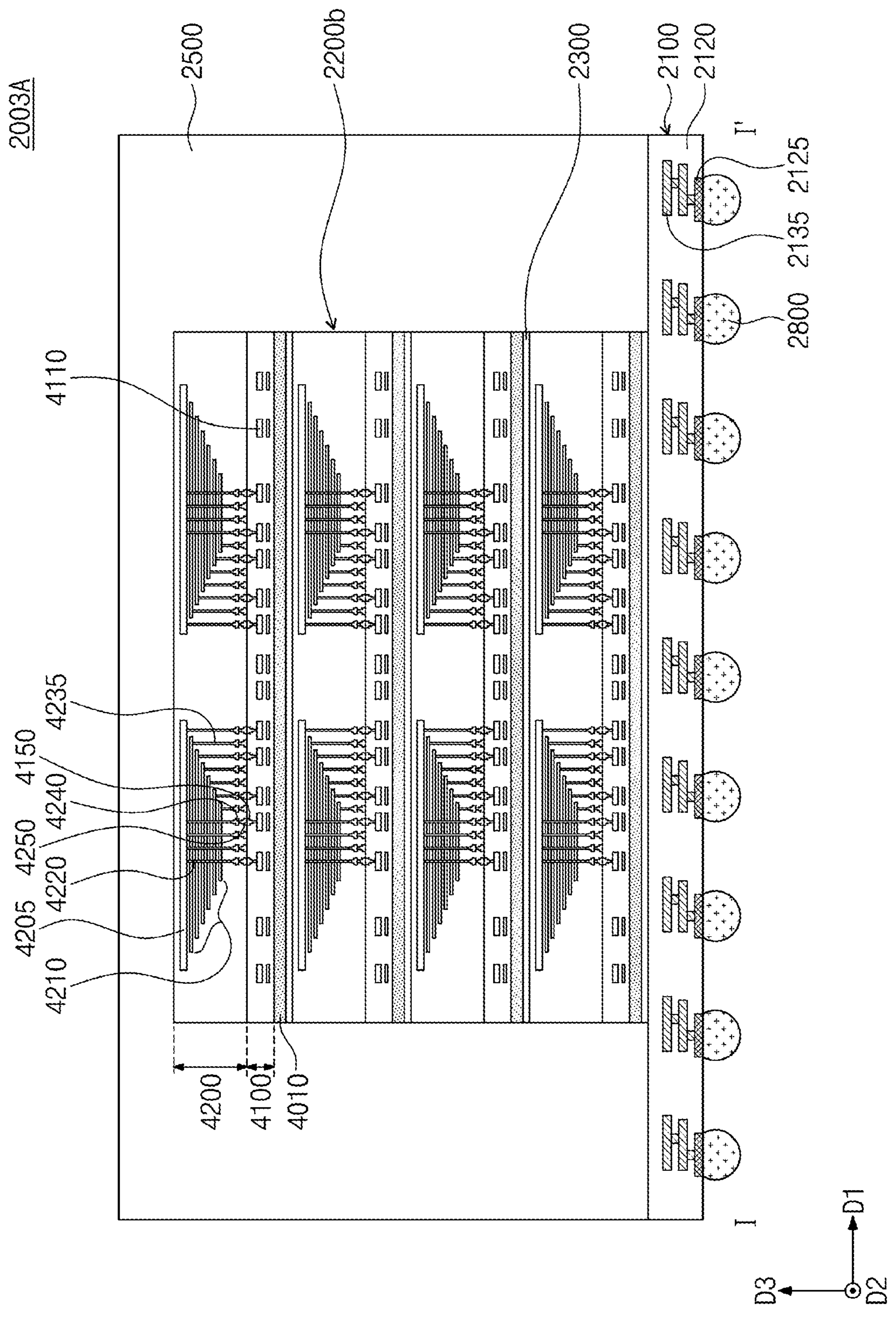

FIGS. 1C and 1D illustrate simplified cross-sectional views showing a semiconductor package according to some embodiments. FIGS. 1C and 1D each depict an exemplary embodiment of the semiconductor package 2003 shown in FIG. 1B, conceptually showing a section taken along line I-I' of the semiconductor package 2003 shown in FIG. 1B.

Referring to FIG. 1C, a printed circuit board may be used as the package substrate 2100 of the semiconductor package 2003. The package substrate 2100 may include a package substrate body 2120, upper pads (see 2130 of FIG. 1B) disposed on a top surface of the package substrate body 2120, lower pads 2125 disposed or exposed on a bottom surface of the package substrate body 2120, and internal wiring lines 2135 that lie in the package substrate body 2120 and electrically connect the upper pads 2130 to the lower pads 2125. The upper pads 2130 may be electrically connected to connection structures (see 2400 of FIG. 1B). The lower pads 2125 may be connected through conductive connection parts 2800 to the wiring patterns 2005 on the main board 2001 of the electronic system 2000, as shown in FIG. 1B.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral wiring lines 3110. The second structure 3200 may include a common source line 3205, a gate stack structure 3210 on the common source line 3205, memory channel structures 3220 that penetrate the gate stack structure 3210, bit lines 3240 electrically connected to the memory channel structures 3220, and gate contact plugs 3235 electrically connected to corresponding word lines (see WL of FIG. 1A) of the gate stack structure 3210.

Each of the semiconductor chips 2200 may include a through wiring line 3245 that is electrically connected to the peripheral wiring line 3110 of the first structure 3100 and extends into the second structure 3200. The through wiring line 3245 may be disposed outside the gate stack structure 3210. In some embodiments, the through wiring line 3245 may penetrate the gate stack structure 3210. Each of the semiconductor chips 2200 may further include an input/output pad (see 2210 of FIG. 1B).

Referring to FIG. 1D, on a semiconductor package 2003A, each of semiconductor chips **2200*b* may include a semiconductor substrate 4010, a first structure 4100 on the semiconductor substrate 4010, and a second structure 4200 provided on and wafer-bonded to the first structure 4100**.

The first structure 4100 may include a peripheral circuit region including a peripheral wiring line 4110 and first bonding structures 4150. The second structure 4200 may include a common source line 4205, a gate stack structure 4210 between the common source line 4205 and the first structure 4100, memory channel structures 4220 that penetrate the gate stack structure 4210, bit lines 4240 electrically connected to the memory channel structures 4220, gate contact plugs 4235 electrically connected to corresponding word lines (see WL of FIG. 1A) of the gate stack structure 4210, and second bonding structures 4250. For example, the second bonding structures 4250 may be electrically connected to corresponding memory channel structures 4220 through the bit lines 4240 electrically connected to the memory channel structures 4220. The first bonding structures 4150 of the first structure 4100 may be bonded to the second bonding structures 4250 of the second structure 4200. The first and second bonding structures 4150 and 4250 may have their bonding portions formed of, for example, copper (Cu). Each of the semiconductor chips 2200 may further include an input/output pad (see 2210 of FIG. 1B).

The semiconductor chips 2200 of FIG. 1C or the semiconductor chips 2200*b* of FIG. 1D may be electrically connected to each other through the connection structures (see 2400 of FIG. 1B) shaped like bonding wires. In some embodiments, semiconductor chips in one semiconductor package, such as the semiconductor chips 2200 of FIG. 1C or the semiconductor chips 2200*b* of FIG. 1D, may be electrically connected to each other through connection structures including through electrodes (TSVs).

Figure 2A:
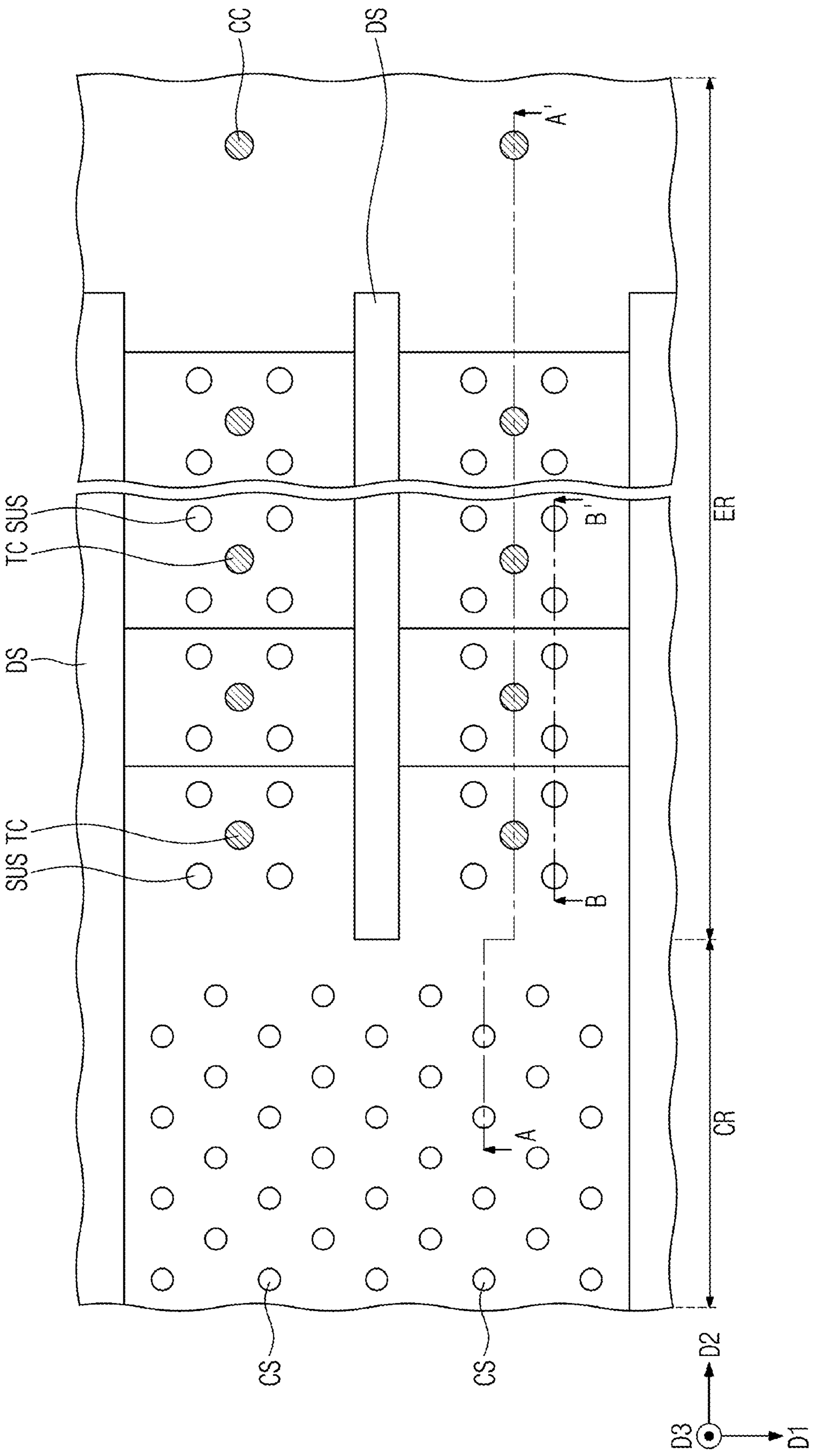
FIG. 2A illustrates a plan view showing a semiconductor device according to some embodiments.
Figure 2B:
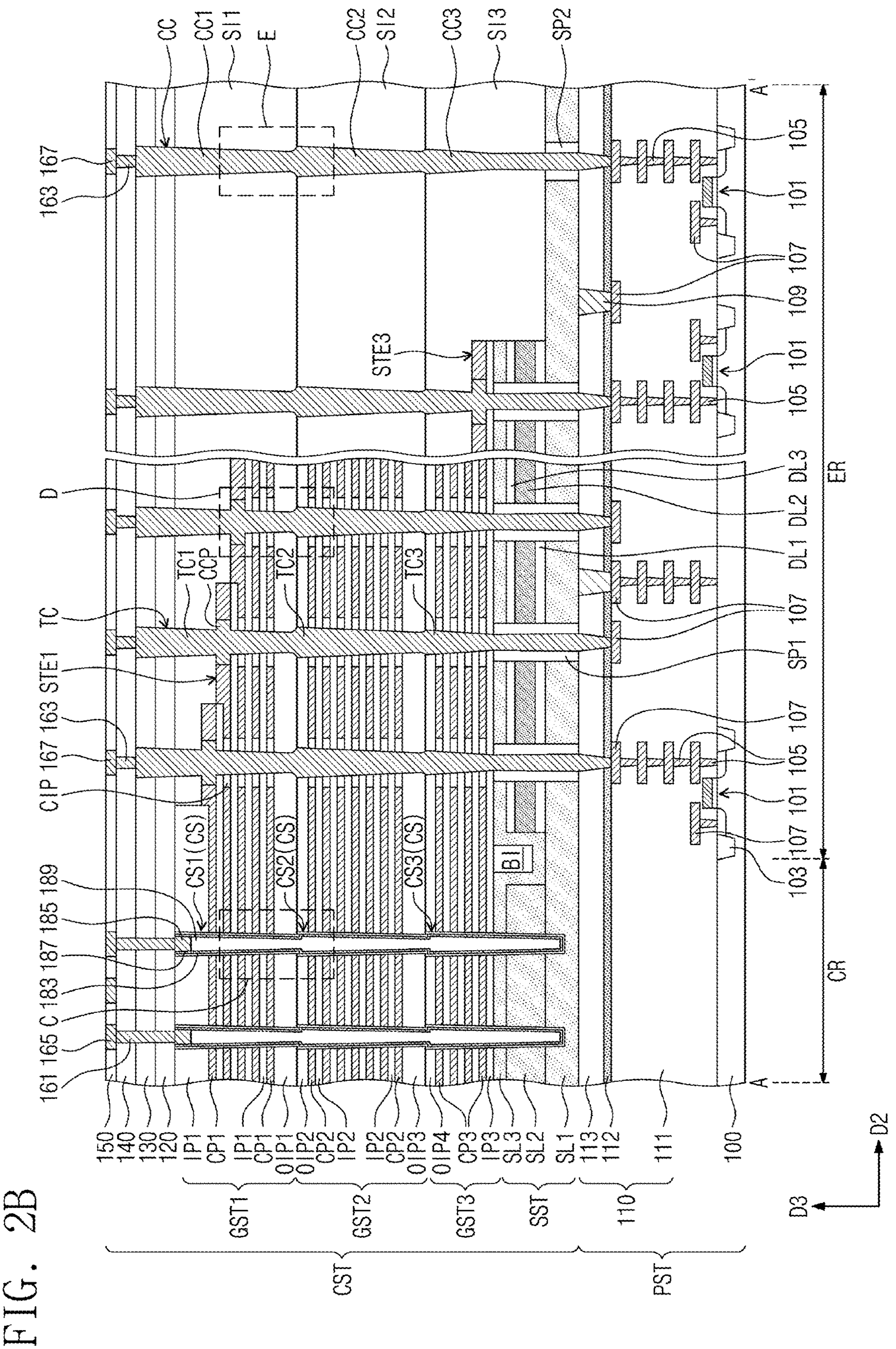
FIG. 2B illustrates a cross-sectional view taken along line A-A' of FIG. 2A.
Figure 2C:
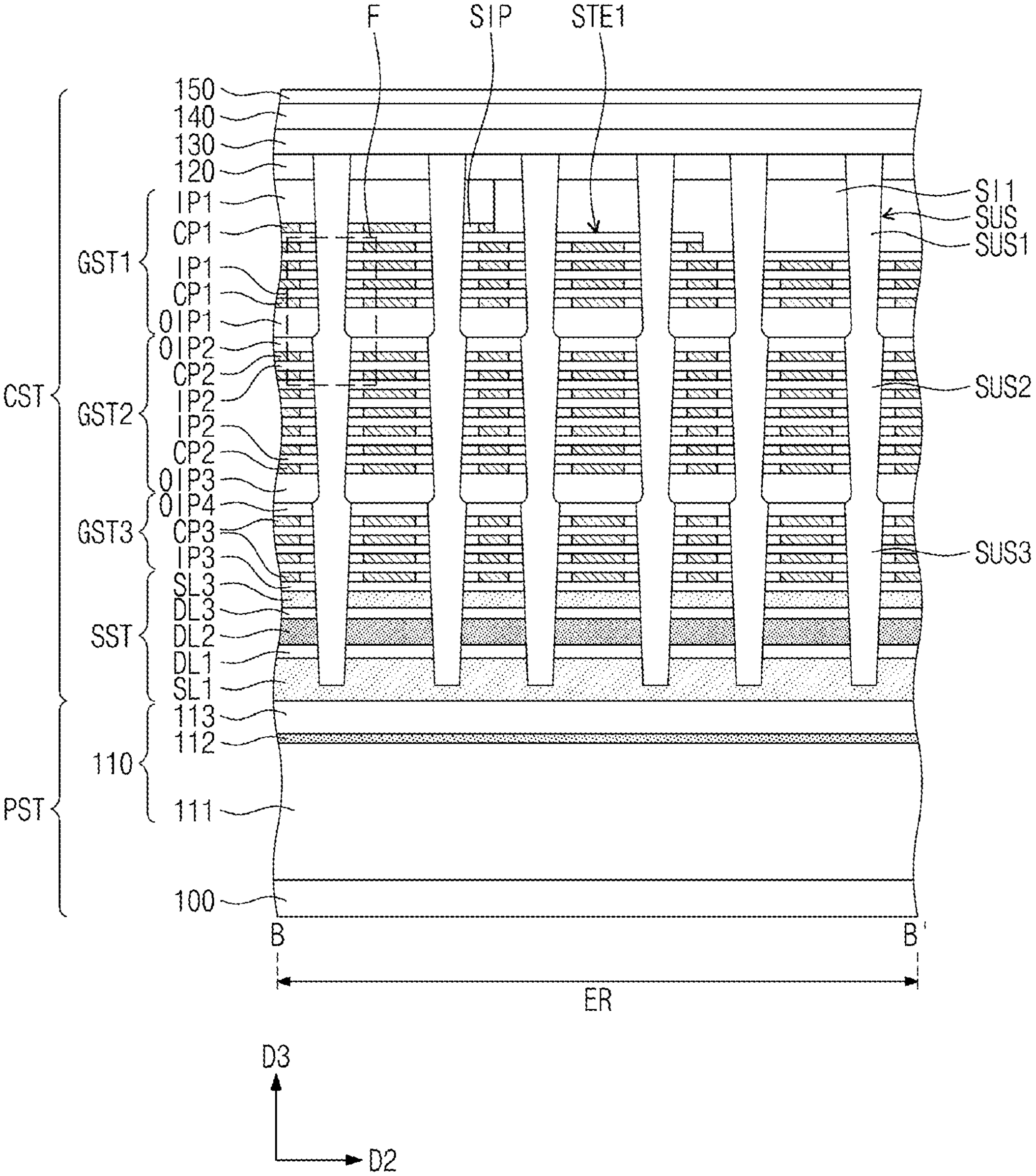
FIG. 2C illustrates a cross-sectional view taken along line B-B' of FIG. 2A.
Figure 2D:
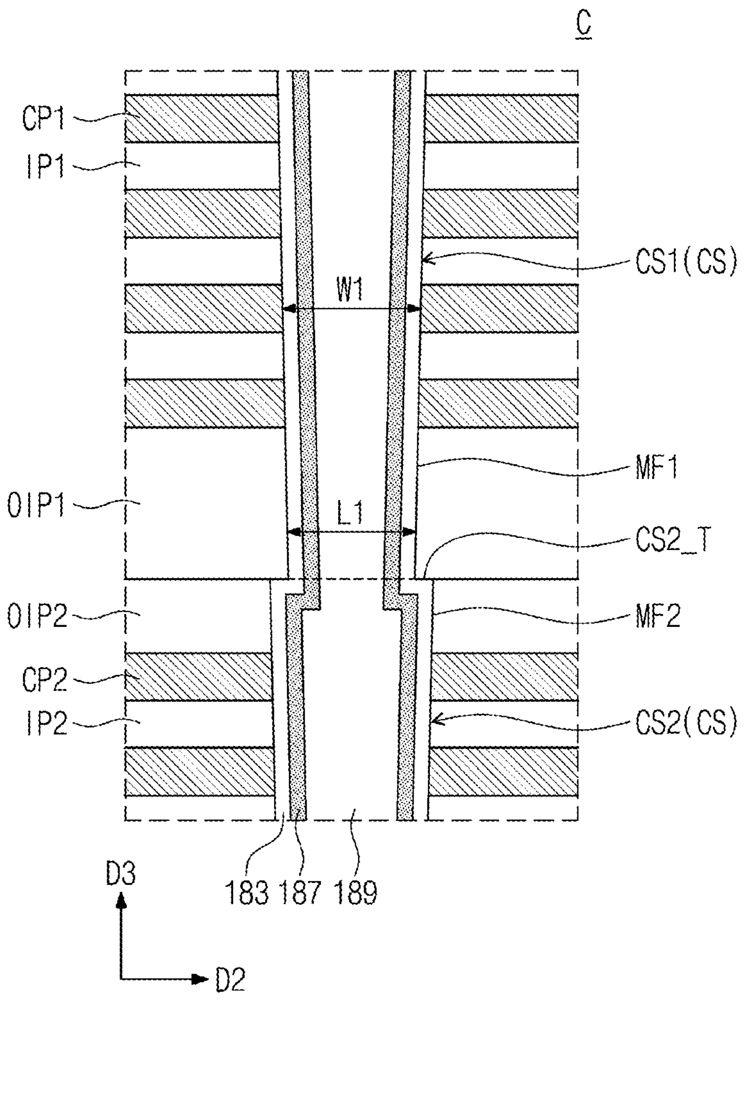
FIG. 2D illustrates an enlarged view showing section C of FIG. 2B.
Figure 2E:
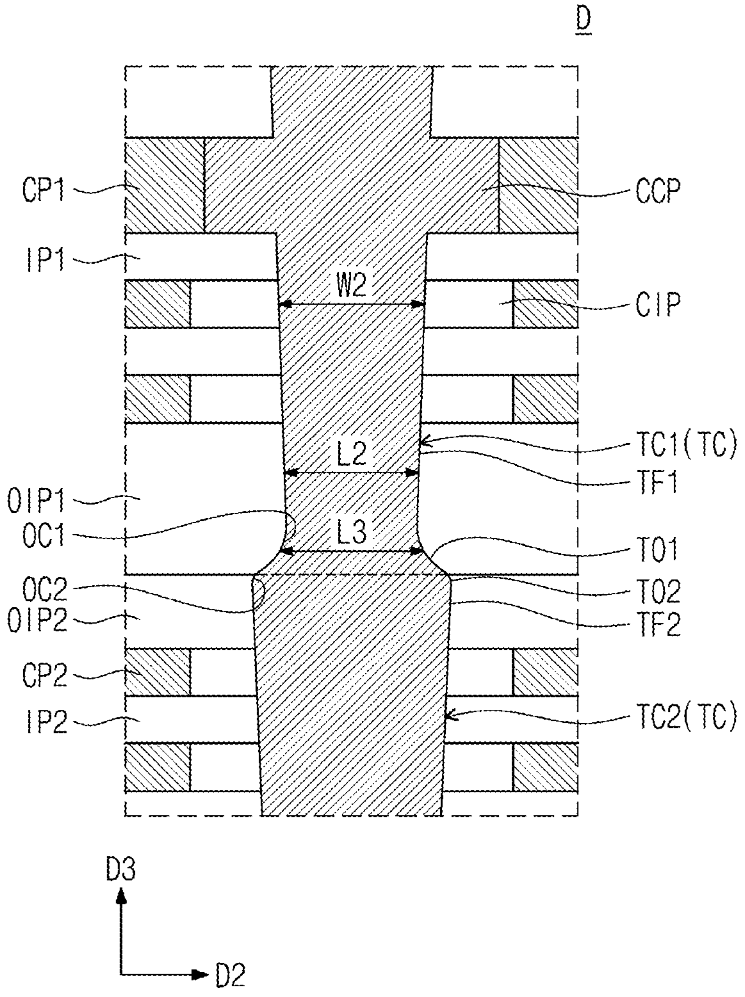
FIG. 2E illustrates an enlarged view showing section D of FIG. 2B.
Figure 2F:
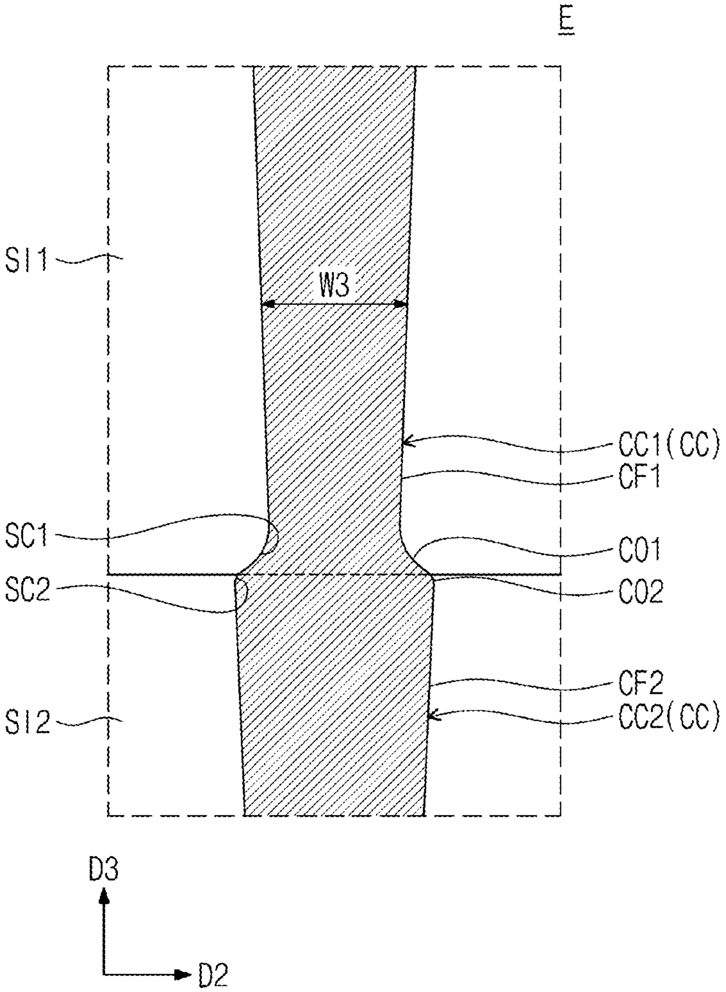
FIG. 2F illustrates an enlarged view showing section E of FIG. 2B.
Figure 2G:
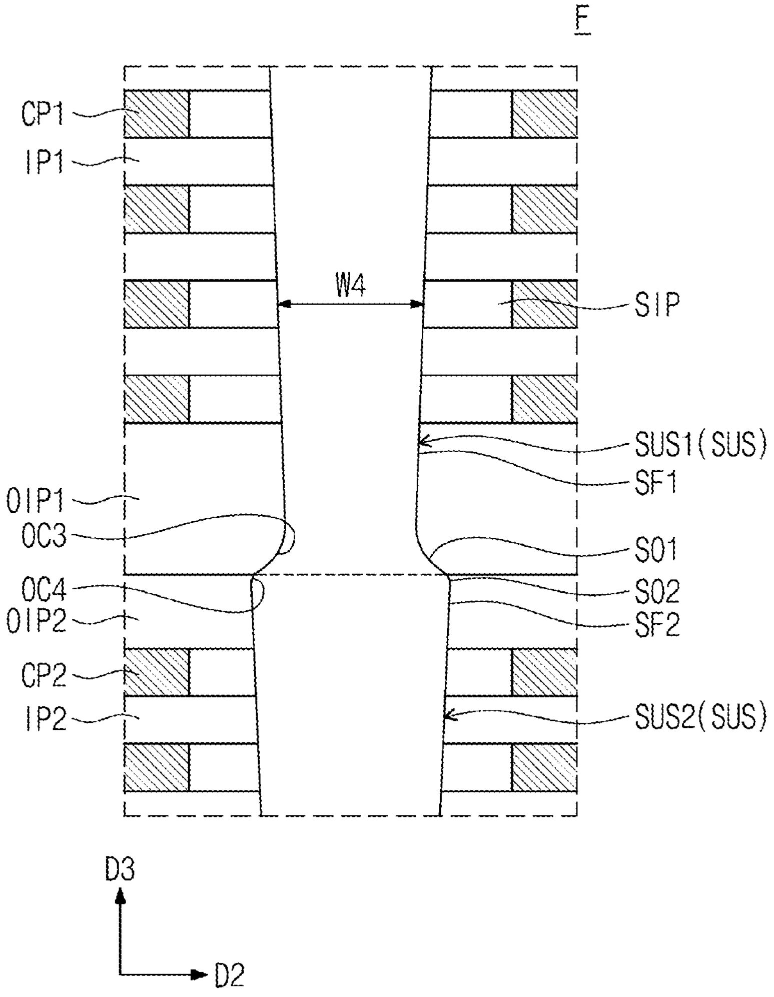
FIG. 2G illustrates an enlarged view showing section F of FIG. 2C.

FIG. 2A illustrates a plan view showing a semiconductor device according to some embodiments. FIG. 2B illustrates a cross-sectional view taken along line A-A' of FIG. 2A. FIG. 2C illustrates a cross-sectional view taken along line B-B' of FIG. 2A. FIG. 2D illustrates an enlarged view showing section C of FIG. 2B. FIG. 2E illustrates an enlarged view showing section D of FIG. 2B. FIG. 2F illustrates an enlarged view showing section E of FIG. 2B. FIG. 2G illustrates an enlarged view showing section F of FIG. 2C.

Referring to FIGS. 2A, 2B, and 2C, a semiconductor device may include a peripheral circuit structure PST and a memory cell structure CST on the peripheral circuit structure PST.

The peripheral circuit structure PST may include a substrate 100. The substrate 100 may have a plate shape that extends along a plane defined by a first direction D1 and a second direction D2. The first direction D1 and the second direction D2 may intersect each other. For example, the first direction D1 and the second direction D2 may be horizontal directions that are orthogonal to each other. In some embodiments, the substrate 100 may be a semiconductor substrate. The substrate 100 may include silicon (Si), germanium (Ge), silicon-germanium (SiGe), gallium phosphide (GaP), or gallium arsenide (GaAs), as examples. In some embodiments, the substrate 100 may be a silicon-on-insulator (SOI) substrate or a germanium-on-insulator (GOI) substrate.

The peripheral circuit structure PST may include a peripheral circuit dielectric structure 110 on the substrate 100. The peripheral circuit dielectric structure 110 may include a first peripheral circuit dielectric layer 111, a second peripheral circuit dielectric layer 112 on the first peripheral circuit dielectric layer 111, and a third peripheral circuit dielectric layer 113 on the second peripheral circuit dielectric layer 112. The first, second, and third peripheral circuit dielectric layers 111, 112, and 113 may include a dielectric material. For example, the first and third peripheral circuit dielectric layers 111 and 113 may include oxide, and the second peripheral circuit dielectric layer 112 may include nitride.

In some embodiments, each of the first, second, and third peripheral circuit dielectric layers 111, 112, and 113 may be a multiple dielectric layer.

The peripheral circuit structure PST may further include a peripheral transistor 101. The peripheral transistor 101 may be provided between the substrate 100 and the peripheral circuit dielectric structure 110. In some embodiments, the peripheral transistor 101 may include source/drain regions, a gate electrode, and a gate dielectric layer. The substrate 100 may have device isolation layers 103 therein. The peripheral transistor 101 may be disposed between the device isolation layers 103. The device isolation layer 103 may include a dielectric material.

The peripheral circuit structure PST may further include peripheral contacts 105 and peripheral conductive lines 107. The peripheral contact 105 may be connected to the peripheral transistor 101 or the peripheral conductive line 107, and the peripheral conductive line 107 may be connected to the peripheral contact 105. The peripheral contact 105 and the peripheral conductive line 107 may be provided in the first peripheral circuit dielectric layer 111 of the peripheral circuit dielectric structure 110. The peripheral contact 105 and the peripheral conductive line 107 may include a conductive material. For example, the peripheral contact 105 and the peripheral conductive line 107 may include a metal.

The peripheral circuit structure PST may further include a source connection contact 109. The source connection contact 109 may be connected to the peripheral conductive line 107 and a first source layer SL1 which will be discussed below. The source connection contact 109 may penetrate the second and third peripheral circuit dielectric layers 112 and 113 of the peripheral circuit dielectric structure 110. The source connection contact 109 may include a conductive material. For example, the source connection contact 109 may include polysilicon.

The memory cell structure CST may include a source structure SST, a first gate stack structure GST1, a second gate stack structure GST2, a third gate stack structure GST3, memory channel structures CS, support structure SUS, a first stepwise dielectric layer SI1, a second stepwise dielectric layer SI2, a third stepwise dielectric layer SI3, a first cover dielectric layer 120, a second cover dielectric layer 130, a third cover dielectric layer 140, a fourth cover dielectric layer 150, separation structures DS, first contacts 161, second contacts 163, bit lines 165, conductive lines 167, through contacts TC, and connection contacts CC.

The source structure SST may include a cell region CR and an extension region ER. The cell region CR and the extension region ER may be areas divided in the first direction D1 and the second direction D2 when viewed in plan.

The source structure SST may include a first source layer SL1 on the peripheral circuit structure PST, a second source layer SL2 on the first source layer SL1, a first dummy layer DL1, a second dummy layer DL2, and a third dummy layer DL3 that are provided on the first source layer SL1, a third source layer SL3 on the second source layer SL2 and the first, second, and third dummy layers DL1, DL2, and DL3.

The first, second, and third source layers SL1, SL2, and SL3 may include a conductive material. For example, the first, second, and third source layers SL1, SL2, and SL3 may include polysilicon. The second source layer SL2 may be disposed on the cell region CR. The second source layer SL2 may be a common source line.

The first dummy layer DL1, the second dummy layer DL2, and the third dummy layer DL3 may be sequentially provided along a third direction D3 on the first source layer SL1. The first, second, and third dummy layers DL1, DL2, and DL3 may be disposed on the extension region ER. The first, second, and third dummy layers DL1, DL2, and DL3 may be located at the same level as that of the second source layer SL2. The first, second, and third dummy layer DL1, DL2, and DL3 may include a dielectric material. In some embodiments, the first and third dummy layers DL1 and DL3 may include the same dielectric material, and the second dummy layer DL2 may include a dielectric material different from that of the first and third dummy layers DL1 and DL3. For example, the second dummy layer DL2 may include a nitride, and the first and third dummy layers DL1 and DL3 may include an oxide.

The third source layer SL3 may cover the second source layer SL2 and the first, second, and third dummy layers DL1, DL2, and DL3. The third source layer SL3 may extend from the cell region CR toward the extension region ER.

In some embodiments, the source structure SST may further include a buried dielectric layer BI on the third source layer SL3. The buried dielectric layer BI may be provided between the cell region CR and the extension region ER. The buried dielectric layer BI may be provided between the second source layer SL2 and the first, second, and third dummy layers DL1, DL2, and DL3. The second source layer SL2 and the first, second, and third dummy layers DL1, DL2, and DL3 may be spaced apart from each other in the second direction D2 across the buried dielectric layer BI and a portion of the third source layer SL3 that surrounds the buried dielectric layer BI. The buried dielectric layer BI may include a dielectric material.

The source structure SST may further include first source dielectric patterns SP1 and second source dielectric patterns SP2. The first and second source dielectric patterns SP1 and SP2 may be disposed on the extension region ER. The first source dielectric pattern SP1 may surround the through contact TC. The second source dielectric pattern SP2 may surround the connection contact CC.

The first source dielectric pattern SP1 may penetrate the third source layer SL3, first to third dummy layers DL1 to DL3, and the first source layer SL1. The first source dielectric pattern SP1 may be surrounded by the third source layer SL3, the first to third dummy layers DL1 to DL3, and the first source layer SL1. The second source dielectric pattern SP2 may penetrate the first source layer SL1. The second source dielectric pattern SP2 may be surrounded by the first source layer SL1. The first and second source dielectric patterns SP1 and SP2 may include a dielectric material. For example, the first and second source dielectric patterns SP1 and SP2 may include an oxide.

The third gate stack structure GST3 may be provided on the source structure SST. The second gate stack structure GST2 may be provided on the third gate stack structure GST3. The first gate stack structure GST1 may be provided on the second gate stack structure GST2. The number of the gate stack structures GST1, GST2, and GST3 may be not limited to those that are shown. In some embodiments, the number of the gate stack structures GST1, GST2, and GST3 may be equal to or less than 2 or equal to or greater than 4.

The first gate stack structure GST1 may include first dielectric patterns IP1 and first conductive patterns CP1 that are alternately stacked along the third direction D3. The third direction D3 may intersect the first direction D1 and the second direction D2. For example, the third direction D3 may be a vertical direction perpendicular to the first direction D1 and the second direction D2. The first dielectric patterns IP1 may include a first connection dielectric pattern OIP1 disposed at bottom of the first dielectric patterns IP1. The first dielectric patterns IP1 and the first conductive patterns CP1 of the first gate stack structure GST1 may define a first stepwise structure STE1 of the first gate stack structure GST1.

The second gate stack structure GST2 may include second dielectric patterns IP2 and second conductive patterns CP2 that are alternately stacked along the third direction D3. The second dielectric patterns IP2 may include a second connection dielectric pattern OIP2 disposed at the top of the second dielectric patterns IP2. The second connection dielectric pattern OIP2 may be in contact with the first connection dielectric pattern OIP1. The second dielectric patterns IP2 may include a third connection dielectric pattern OIP3 disposed at bottom of the second dielectric patterns IP2. The second dielectric patterns IP2 and the second conductive patterns CP2 of the second gate stack structure GST2 may define a second stepwise structure (not shown) of the second gate stack structure GST2.

The third gate stack structure GST3 may include third dielectric patterns IP3 and third conductive patterns CP3 that are alternately stacked along the third direction D3. The third dielectric patterns IP3 may include a fourth connection dielectric pattern OIP4 disposed at the top of the third dielectric patterns IP3. The fourth connection dielectric pattern OIP4 may be in contact with the third connection dielectric pattern OIP3. The third dielectric patterns IP3 and the third conductive patterns CP3 of the third gate stack structure GST3 may define a third stepwise structure STE3 of the third gate stack structure GST3.

The first, second, and third dielectric patterns IP1, IP2, and IP3 may include a third dielectric material. For example, the first, second, and third dielectric patterns IP1, IP2, and IP3 may include an oxide. The first, second, and third conductive patterns CP1, CP2, and CP3 may include a conductive material. For example, the first, second, and third conductive patterns CP1, CP2, and CP3 may include tungsten.

Each of the first, second, and third gate stack structures GST1, GST2, and GST3 may further include contact dielectric patterns CIP. The contact dielectric pattern CIP may be located at the same level as that of one of the first, second, and third conductive patterns CP1, CP2, and CP3. The contact dielectric pattern CIP may surround the through contact TC. The contact dielectric pattern CIP may be disposed between the through contact TC and the first conductive pattern CP1, between the through contact TC and the second conductive pattern CP2, or between the through contact TC and the third conductive pattern CP3. The contact dielectric pattern CIP may include a dielectric material. For example, the contact dielectric pattern CIP may include an oxide.

Each of the first, second, and third gate stack structures GST1, GST2, and GST3 may further include support dielectric patterns SIP. The support dielectric pattern SIP may be located at the same level as that of one of the first, second, and third conductive patterns CP1, CP2, and CP3. The support dielectric pattern SIP may surround the support structure SUS. The support dielectric pattern SIP may be disposed between the support structure SUS and the first conductive pattern CP1, between the through contact TC and the second conductive pattern CP2, or between the through contact TC and the third conductive pattern CP3. The support dielectric pattern SIP may include a dielectric material. For example, the support dielectric pattern SIP may include an oxide.

The first stepwise dielectric layer SI1 may cover the first stepwise structure STE1 of the first gate stack structure GST1. The first stepwise dielectric layer SI1 may be located at the same level as that of the first gate stack structure GST1. The first gate stack structure GST1 may have a top surface located at the same level as a top surface of the first stepwise dielectric layer SU1. The first connection dielectric pattern OIP1 of the first gate stack structure GST1 may have a bottom surface located at the same level as a bottom surface of the first stepwise dielectric layer SI1. In some embodiments, the first stepwise dielectric layer SI1 may surround the first gate stack structure GST1.

The first stepwise dielectric layer SI1 may be provided on the second stepwise dielectric layer SI2. The second stepwise dielectric layer SI2 may cover the second stepwise structure of the second gate stack structure GST2. The second stepwise dielectric layer SI2 may be located at the same level as that of the second gate stack structure GST2. The second connection dielectric pattern OIP2 of the second gate stack structure GST2 may have a top surface located at the same level as a top surface of the second stepwise dielectric layer SI2. The third connection dielectric pattern OIP3 of the second gate stack structure GST2 may have a bottom surface located at the same level as a bottom surface of the second stepwise dielectric layer SI2. In some embodiments, the second stepwise dielectric layer SI2 may surround the second gate stack structure GST2.

The second stepwise dielectric layer SI2 may be provided on the third stepwise dielectric layer SI3. The third stepwise dielectric layer SI3 may cover the third stepwise structure STE3 of the third gate stack structure GST3. The third stepwise dielectric layer SI3 may be located at the same level as the third gate stack structure GST3. The fourth connection dielectric pattern OIP4 of the third gate stack structure GST3 may be located at the same level as a top surface of the third stepwise dielectric layer SI3. In some embodiments, the third stepwise dielectric layer SI3 may surround the third gate stack structure GST3.

The first, second, and third stepwise dielectric layers SI1, SI2, and SI3 may include a dielectric material. For example, the first, second, and third stepwise dielectric layers SI1, SI2, and SI3 may include an oxide.

The memory channel structures CS may extend in the third direction D3 to penetrate the first gate stack structure GST1, the second gate stack structure GST2, the third gate stack structure GST3, the third source layer SL3, and the second source layer SL2. The memory channel structure CS may include a first memory portion CS1 that penetrates the first gate stack structure GST1, a second memory portion CS2 that penetrates the second gate stack structure GST2, and a third memory portion CS3 that penetrates the third gate stack structure GST3. The second memory portion CS2 may be provided on the third memory portion CS3, and the first memory portion CS1 may be provided on the second memory portion CS2. The first memory portion CS1 may be disposed in the first gate stack structure GST1, the second memory portion CS2 may be disposed in the second gate stack structure GST2, and the third memory portion CS3 may be disposed in the third gate stack structure GST3.

The first memory portion CS1 may have a width that decreases as its level becomes lower (or with decreasing distance from the substrate 100). The second memory portion CS2 may have a width that decreases as its level becomes lower (or with decreasing distance from the substrate 100). The third memory portion CS3 may have a width that decreases as its level becomes lower (or with decreasing distance from the substrate 100).

Each of the memory channel structures CS may include a dielectric capping layer 189, a channel layer 187 that surrounds the dielectric capping layer 189, and a memory layer 183 that surrounds the channel layer 187.

The dielectric capping layer 189 may include a dielectric material. For example, the dielectric capping layer 189 may include an oxide. The channel layer 187 may include a conductive material. For example, the channel layer 187 may include polysilicon. The channel layer 187 may be electrically connected to the second source layer SL2. The second source layer SL2 may penetrate the memory layer 183 to come into contact with and connect to the channel layer 187.

The memory layer 183 may store data. In some embodiments, the memory layer 183 may include a tunnel dielectric layer that surrounds the channel layer 187, a data storage layer that surrounds the tunnel dielectric layer, and a blocking layer that surrounds the data storage layer.

Each of the memory channel structures CS may further include a bit-line pad 185 provided on the channel layer 187. The bit-line pad 185 may include a conductive material. For example, the bit-line pad 185 may include polysilicon or a metal.

The first cover dielectric layer 120 may be provided on the first stepwise dielectric layer SI1 and the memory channel structures CS. The first cover dielectric layer 120 may include a dielectric material.

The support structures SUS may extend in the third direction D3. The support structure SUS may penetrate the first cover dielectric layer 120, at least one selected from the first stepwise dielectric layer SI1 and the first gate stack structure GST1, at least one selected from the second stepwise dielectric layer SI2 and the second gate stack structure GST2, at least one selected from the third stepwise dielectric layer SI3 and the third gate stack structure GST3, the third source layer SL3, the third dummy layer DL3, the second dummy layer DL2, and the first dummy layer DL1.

The support structure SUS may include a first support portion SUS1 located at the same level as that of the first memory portion CS1, a second support portion SUS2 located at the same level as that of the second memory portion CS2, and a third support portion SUS3 located at the same level as that of the third memory portion CS3. The second support portion SUS2 may be provided on the third support portion SUS3, and the first support portion SUS1 may be provided on the second support portion SUS2. The first support portion SUS1 may penetrate at least one selected from the first stepwise dielectric layer SI1 and the first gate stack structure GST1. The second support portion SUS2 may penetrate at least one selected from the second stepwise dielectric layer SI2 and the second gate stack structure GST2. The third support portion SUS3 may penetrate at least one selected from the third stepwise dielectric layer SI3 and the third gate stack structure GST3.

The support structure SUS may include a dielectric material. For example, the support structure SUS may include an oxide.

The second cover dielectric layer 130 may be provided on the first cover dielectric layer 120 and the support structures SUS. The second cover dielectric layer 130 may include a dielectric material.

The through contacts TC may extend in the third direction D3. The through contact TC may penetrate the second cover dielectric layer 130, the first cover dielectric layer 120, at least one selected from the first stepwise dielectric layer SI1 and the first gate stack structure GST1, at least one selected from the second stepwise dielectric layer SI2 and the second gate stack structure GST2, at least one selected from the third stepwise dielectric layer SI3 and the third gate stack structure GST3, the third source layer SL3, the third dummy layer DL3, the second dummy layer DL2, the first dummy layer DL1, the first source layer SL1, the first source dielectric pattern SP1, the third peripheral circuit dielectric layer 113, and the second peripheral circuit dielectric layer 112. The through contact TC may be connected to the peripheral conductive line 107.

The through contact TC may include a first through portion TC1 located at the same level as that of the first memory portion CS1 and the first support portion SUS1, a second through portion TC2 located at the same level as that of the second memory portion CS2 and the second support portion SUS2, and a third through portion TC3 located at the same level as that of the third memory portion CS3 and the third support portion SUS3.

The second through portion TC2 may be provided on the third through portion TC3, and the first through portion TC1 may be provided on the second through portion TC2. The first through portion TC1 may penetrate at least one selected from the first stepwise dielectric layer SI1 and the first gate stack structure GST1. The second through portion TC2 may penetrate at least one selected from the second stepwise dielectric layer SI2 and the second gate stack structure GST2. The third through portion TC3 may penetrate at least one selected from the third stepwise dielectric layer SI3 and the third gate stack structure GST3.

The through contact TC may include a contact connection portion CCP connected to one of the first, second, and third conductive patterns CP1, CP2, and CP3. The through contact TC may include a conductive material.

The connection contacts CC may extend in the third direction D3. The connection contact CC may penetrate the second cover dielectric layer 130, the first cover dielectric layer 120, the first stepwise dielectric layer SI1, the second stepwise dielectric layer SI2, the third stepwise dielectric layer SI3, the first source layer SL1, the second source dielectric pattern SP2, the third peripheral circuit dielectric layer 113, and the second peripheral circuit dielectric layer 112. The connection contact CC may be connected to the peripheral conductive line 107.

The connection contact CC may include a first connection portion CC1 located at the same level as that of the first memory portion CS1, the first support portion SUS1, and the first through portion TC1, a second connection portion CC2 located at the same level as that of the second memory portion CS2, the second support portion SUS2, and the second through portion TC2, and a third connection portion CC3 located at the same level as that of the third memory portion CS3, the third support portion SUS3, and the third through portion TC3.

The second connection portion CC2 may be provided on the third connection portion CC3, and the first connection portion CC1 may be provided on the second connection portion CC2. The first connection portion CC1 may penetrate the first stepwise dielectric layer SI1. The second connection portion CC2 may penetrate the second stepwise dielectric layer SI2. The third connection portion CC3 may penetrate the third stepwise dielectric layer SI3.

The first connection dielectric pattern OIP1 of the first gate stack structure GST1 and the second connection dielectric pattern OIP2 of the second gate stack structure GST2 may have therebetween an interface located at a level defined by the bottom surface of the first connection dielectric pattern OIP1 of the first gate stack structure GST1 and the top surface of the second connection dielectric pattern OIP2 of the second gate stack structure GST2.

The first stepwise dielectric layer SI1 and the second stepwise dielectric layer SI2 may have therebetween an interface located at a level defined by the bottom surface of the first stepwise dielectric layer SI1 and the top surface of the second stepwise dielectric layer SI2.

The third connection dielectric pattern OIP3 of the second gate stack structure GST2 and the fourth connection dielectric pattern OIP4 of the third gate stack structure GST3 may have therebetween an interface located at a level defined by the bottom surface of the third connection dielectric pattern OIP3 of the second gate stack structure GST2 and the top surface of the fourth connection dielectric pattern OIP4 of the third gate stack structure GST3.

The second stepwise dielectric layer SI2 and the third stepwise dielectric layer SI3 may have therebetween an interface located at a level defined by the bottom surface of the second stepwise dielectric layer SI2 and the top surface of the third stepwise dielectric layer SI3.

An interface between the first memory portion CS1 and the second memory portion CS2, an interface between the first through portion TC1 and the second through portion TC2, an interface between the first connection portion CC1 and the second connection portion CC2, and an interface between the first support portion SUS1 and the second support portion SUS2 may be located at the same level as that of the interface between the first connection dielectric pattern OIP1 of the first gate stack structure GST1 and the second connection dielectric pattern OIP2 of the second gate stack structure GST2 and that of the interface between the first stepwise dielectric layer SI1 and the second stepwise dielectric layer SI2.

The first memory portion CS1, the first through portion TC1, the first connection portion CC1, and the first support portion SUS1 may each be located at a higher level than that of the second gate stack structure GST2. The second memory portion CS2, the second through portion TC2, the second connection portion CC2, and the second support portion SUS2 may each be located at a lower level than that of the first gate stack structure GST1.

An interface between the second memory portion CS2 and the third memory portion CS3, an interface between the second through portion TC2 and the third through portion TC3, an interface between the second connection portion CC2 and the third connection portion CC3, and an interface between the second support portion SUS2 and the third support portion SUS3 may be located at the same level as that of the interface between the third connection dielectric pattern OIP3 of the second gate stack structure GST2 and the fourth connection dielectric pattern OIP4 of the third gate stack structure GST3 and that of the interface between the second stepwise dielectric layer SI2 and the third stepwise dielectric layer SI3.

The second memory portion CS2, the second through portion TC2, the second connection portion CC2, and the second support portion SUS2 may each be located at a higher level than that of the third gate stack structure GST3. The third memory portion CS3, the third through portion TC3, the third connection portion CC3, and the third support portion SUS3 may each be located at a lower level than that of the second gate stack structure GST2.

The third cover dielectric layer 140 may be provided on the second cover dielectric layer 130, the through contacts TC, and the connection contacts CC. The fourth cover dielectric layer 150 may be provided on the third cover dielectric layer 140. The third and fourth cover dielectric layers 140 and 150 may include a dielectric material.

The memory channel structure CS may have an uppermost portion located at a lower level than that of an uppermost portion of the support structure SUS, an uppermost portion of the connection contact CC, and an uppermost portion of the through contact TC. The level of the uppermost portion of the support structure SUS may be lower than that of the uppermost portion of the connection contact CC and that of the uppermost portion of the through contact TC. The level of the uppermost portion of the connection contact CC may be the same as that of the uppermost portion of the through contact TC.

The separation structures DS may penetrate the first, second, and third gate stack structures GST1, GST2, and GST3. The separation structures DS may extend in the second direction D2. The separation structures DS may include a dielectric material. In some embodiments, the separation structures DS may further include a conductive material.

The first contact 161 may be connected to the memory channel structure CS. The first contact 161 may penetrate the first, second, and third cover dielectric layers 120, 130, and 140. The second contact 163 may be connected to the through contact TC or the connection contact CC. The second contact 163 may penetrate the third cover dielectric layer 140. The bit line 165 may be connected to the first contact 161. The bit line 165 may be disposed in the fourth cover dielectric layer 150. The bit line 165 may extend in the first direction D1. The conductive line 167 may be connected to the second contact 163. The conductive line 167 may be disposed in the fourth cover dielectric layer 150. The first contact 161, the second contact 163, the bit line 165, and the conductive line 167 may include a conductive material.

Referring to FIGS. 2A, 2B, 2C, 2D, 2E, 2F, and 2G, on the same level, the width of the first memory portion CS1 may be less than that of the first through portion TC1, that of the first connection portion CC1, and that of the first support portion SUS1. For example, on the same level, a width W1 in the second direction D2 of the first memory portion CS1 may be less than a width W2 in the second direction D2 of the first through portion TC1, a width W3 in the second direction D2 of the first connection portion CC1, and a width W3 in the second direction D2 of the first support portion SUS1. On the same level, a difference in width between the first memory portion CS1 and one of the first through portion TC1, the first connection portion CC1, and the first support portion SUS1 may be, for example, equal to or greater than about 80 nm.

The first memory portion CS1 may have a minimum width less than that of the first through portion TC1, that of the first connection portion CC1, and that of the first support portion SUS1. For example, a minimum width in the second direction D2 of the first memory portion CS1 may be less than a minimum width in the second direction D2 of the first through portion TC1, a minimum width in the second direction D2 of the first connection portion CC1, and a minimum width in the second direction D2 of the first support portion SUS1. A difference in minimum width between the first memory portion CS1 and one of the first through portion TC1, the first connection portion CC1, and the first support portion SUS1 may be, for example, equal to or greater than about 80 nm.

On the same level, the width of the second memory portion CS2 may be less than that of the second through portion TC2, that of the second connection portion CC2, and that of the second support portion SUS2. On the same level, a difference in width between the second memory portion CS2 and one of the second through portion TC2, the second connection portion CC2, and the second support portion SUS2 may be, for example, equal to or greater than about 80 nm.

The second memory portion CS2 may have a minimum width less than that of the second through portion TC2, that of the second connection portion CC2, and that of the second support portion SUS2. A difference in minimum width between the second memory portion CS2 and one of the second through portion TC2, the second connection portion CC2, and the second support portion SUS2 may be, for example, equal to or greater than about 80 nm.

The second memory portion CS2 may have a maximum width less than that of the second through portion TC2, that of the second connection portion CC2, and that of the second support portion SUS2. A difference in maximum width between the second memory portion CS2 and one of the second through portion TC2, the second connection portion CC2, and the second support portion SUS2 may be, for example, equal to or greater than about 80 nm.

On the same level, the width of the third memory portion CS3 may be less than that of the third through portion TC3, that of the third connection portion CC3, and that of the third support portion SUS3. On the same level, a difference in width between the third memory portion CS3 and one of the third through portion TC3, the third connection portion CC3, and the third support portion SUS3 may be, for example, equal to or greater than about 80 nm.

The third memory portion CS3 may have a maximum width less than that of the third through portion TC3, that of the third connection portion CC3, and that of the third support portion SUS3. A difference in maximum width between the third memory portion CS3 and one of the third through portion TC3, the third connection portion CC3, and the third support portion SUS3 may be, for example, equal to or greater than about 80 nm.

The first memory portion CS1 may include a first memory flat surface MF1 in contact with a sidewall of the first connection dielectric pattern OIP1. The first memory flat surface MF1 may be flat when viewed in vertical section as shown in FIG. 2D. A distance between facing segments of the first memory flat surface MF1 may decrease as their level becomes lower (or with decreasing distance from the substrate 100). For example, a distance L1 in the second direction D2 between facing segments of the first memory flat surface MF1 may decrease as their level becomes lower (or with decreasing distance from the substrate 100).

The second memory portion CS2 may include a second memory flat surface MF2 in contact with a sidewall of the second connection dielectric pattern OIP2. The second memory flat surface MF2 may be flat when viewed in vertical section as shown in FIG. 2D. A distance between facing segments of the second memory flat surface MF2 may decrease as their level becomes lower (or with decreasing distance from the substrate 100).

The second memory portion CS2 may include a top surface CS2_T in contact with the bottom surface of the first connection dielectric pattern OIP1.

The first through portion TC1 may include a first through flat surface TF1 and a first through curved surface TO1 that are in contact with the first connection dielectric pattern OIP1. The first through curved surface TO1 may be located at a lower level than that of the first through flat surface TF1. The first through curved surface TO1 may be connected to the second through portion TC2.

The first through flat surface TF1 may be flat when viewed in vertical section as shown in FIG. 2E. The first through curved surface TO1 may be curved when viewed in vertical section as shown in FIG. 2E. The first through curved surface TO1 may be concave toward the through contact TC when viewed in vertical section as shown in FIG. 2E. A distance between facing segments of the first through flat surface TF1 may decrease as their level becomes lower (or with decreasing distance from the substrate 100). For example, a distance L2 in the second direction D2 between facing segments of the first through flat surface TF1 may decrease as their level becomes lower (or with decreasing distance from the substrate 100). A distance between facing segments of the first through curved surface TO1 may increase as their level becomes lower (or with decreasing distance from the substrate 100). For example, a distance L3 in the second direction D2 between facing segments of the first through curved surface TO1 may increase as their level becomes lower (or with decreasing distance from the substrate 100).

The second through portion TC2 may include a second through flat surface TF2 and a second through curved surface TO2 that are in contact with the second connection dielectric pattern OIP2. The second through curved surface TO2 may be located at a higher level than that of the second through flat surface TF2. The second through curved surface TO2 may be connected to the first through curved surface TO1 of the first through portion TC1.

The second through flat surface TF2 may be flat when viewed in vertical section as shown in FIG. 2E. The second through curved surface TO2 may be curved when viewed in vertical section as shown in FIG. 2E. The second through curved surface TO2 may be convex toward the second connection dielectric pattern OIP2 when viewed in vertical section as shown in FIG. 2E. A distance between facing segments of the second through flat surface TF2 may decrease as their level becomes lower (or with decreasing distance from the substrate 100). A distance between facing segments of the second through curved surface TO2 may increase as their level becomes lower (or with decreasing distance from the substrate 100).

The first connection dielectric pattern OIP1 may include a first connection dielectric curved surface OC1 in contact with the first through curved surface TO1 of the first through portion TC1. The first connection dielectric curved surface OC1 may be curved when viewed in vertical section as shown in FIG. 2E. The first connection dielectric curved surface OC1 may be convex toward the through contact TC when viewed in vertical section as shown in FIG. 2E. The second connection dielectric pattern OIP2 may include a second connection dielectric curved surface OC2 in contact with the second through curved surface TO2 of the second through portion TC2. The second connection dielectric curved surface OC2 may be curved when viewed in vertical section as shown in FIG. 2E. The second connection dielectric curved surface OC2 may be concave toward the second connection dielectric pattern OIP2 when viewed in vertical section as shown in FIG. 2E.

The first connection portion CC1 may include a first connection curved surface CO1 and a first connection flat surface CF1. The first connection curved surface CO1 may be located at a lower level than that of the first connection flat surface CF1. The first connection curved surface CO1 may be connected to the second connection portion CC2.

The first connection flat surface CF1 may be flat when viewed in vertical section as shown in FIG. 2F. The first connection curved surface CO1 may be curved when viewed in vertical section as shown in FIG. 2F. The first connection curved surface CO1 may be concave toward the through contact TC when viewed in vertical section as shown in FIG. 2F. A distance between facing segments of the first connection flat surface CF1 may decrease as their level becomes lower (or with decreasing distance from the substrate 100). A distance between facing segments of the first connection curved surface CO1 may increase as their level becomes lower (or with decreasing distance from the substrate 100).

The second connection portion CC2 may include a second connection curved surface CO2 and a second connection flat surface CF2. The second connection curved surface CO2 may be located at a higher level than that of the second connection flat surface CF2. The second connection curved surface CO2 may be connected to the first connection curved surface CO1 of the first connection portion CC1.

The second connection flat surface CF2 may be flat when viewed in vertical section as shown in FIG. 2F. The second connection curved surface CO2 may be curved when viewed in vertical section as shown in FIG. 2F. The second connection curved surface CO2 may be convex toward the second stepwise dielectric layer SI2 when viewed in vertical section as shown in FIG. 2F. A distance between facing segments of the second connection flat surface CF2 may decrease as their level becomes lower (or with decreasing distance from the substrate 100). A distance between facing segments of the second connection curved surface CO2 may increase as their level becomes lower (or with decreasing distance from the substrate 100).

The first stepwise dielectric layer SI1 may include a first stepwise dielectric curved surface SC1 in contact with the first connection curved surface CO1 of the first connection portion CC1. The first stepwise dielectric curved surface SC1 may be curved when viewed in vertical section as shown in FIG. 2F. The first stepwise dielectric curved surface SC1 may be convex toward the through contact TC when viewed in vertical section as shown in FIG. 2F. The second stepwise dielectric layer SI2 may include a second stepwise dielectric curved surface SC2 in contact with the second connection curved surface CO2 of the second connection portion CC2. The second stepwise dielectric curved surface SC2 may be curved when viewed in vertical section as shown in FIG. 2F. The second stepwise dielectric curved surface SC2 may be concave toward the second stepwise dielectric layer SI2 when viewed in vertical section as shown in FIG. 2F.

The first support portion SUS1 may have a first support flat surface SF1 and a first support curved surface SO1 that are in contact with the first connection dielectric pattern OIP1. The first support curved surface SO1 may be located at a lower level than that of the first support flat surface SF1. The first support curved surface SO1 may be connected to the second support portion SUS2.

The first support flat surface SF1 may be flat when viewed in vertical section as shown in FIG. 2G. The first support curved surface SO1 may be curved when viewed in plan as shown in FIG. 2G. The first support curved surface SO1 may be concave toward the support structure SUS when viewed in plan as shown in FIG. 2G. A distance between facing segments of the first support flat surface SF1 may decrease as their level becomes lower (or with decreasing distance from the substrate 100). A distance between facing segments of the first support curved surface SO1 may increase as their level becomes lower (or with decreasing distance from the substrate 100).

The second support portion SUS2 may have a second support flat surface SF2 and a second support curved surface SO2 that are in contact with the second connection dielectric pattern OIP2. The second support curved surface SO2 may be located at a higher level than that of the second support flat surface SF2. The second support curved surface SO2 may be connected to the first support curved surface SO1 of the first support portion SUS1.

The second support flat surface SF2 may be flat when viewed in vertical section as shown in FIG. 2G. The second support curved surface SO2 may be curved when viewed in plan as shown in FIG. 2G. The second support curved surface SO2 may be convex toward the second connection dielectric pattern OIP2 when viewed in vertical section as shown in FIG. 2G. A distance between facing segments of the second support flat surface SF2 may decrease as their level becomes lower (or with decreasing distance from the substrate 100). A distance between facing segments of the second support curved surface SO2 may increase as their level becomes lower (or with decreasing distance from the substrate 100).

The first connection dielectric pattern OIP1 may include a third connection dielectric curved surface OC3 in contact with the first support curved surface SO1 of the first support portion SUS1. The second connection dielectric pattern OIP2 may include a fourth connection dielectric curved surface OC4 in contact with the second support curved surface SO2 of the second support portion SUS2.

In a semiconductor device according to some embodiments, as a connection contact has a relatively large width, the connection contact may improve in resistance.

In a semiconductor device according to some embodiments, as a through contact has a relatively large width, the through contact may improve in resistance.

Figure 6A:
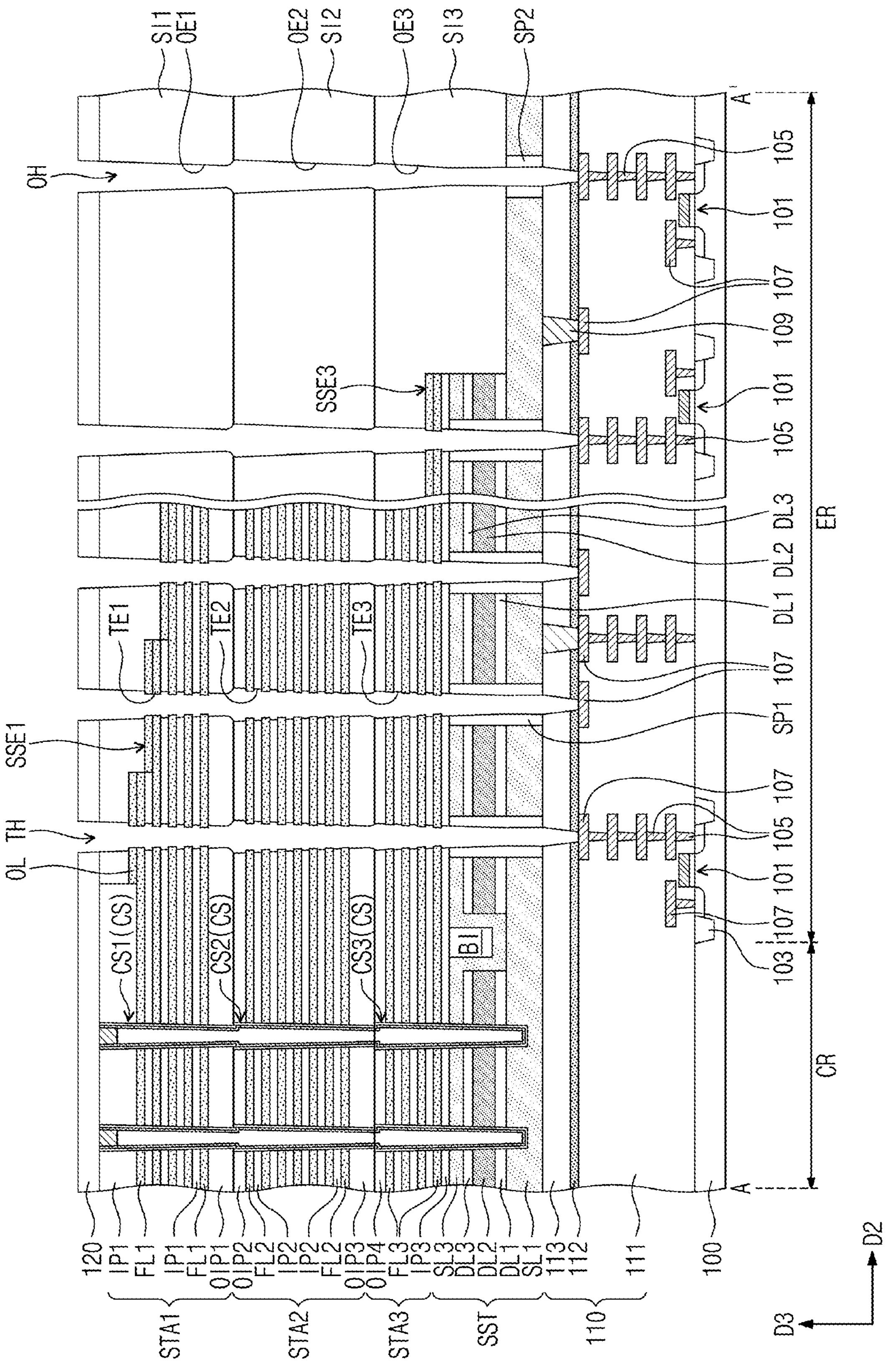
Figure 6B:
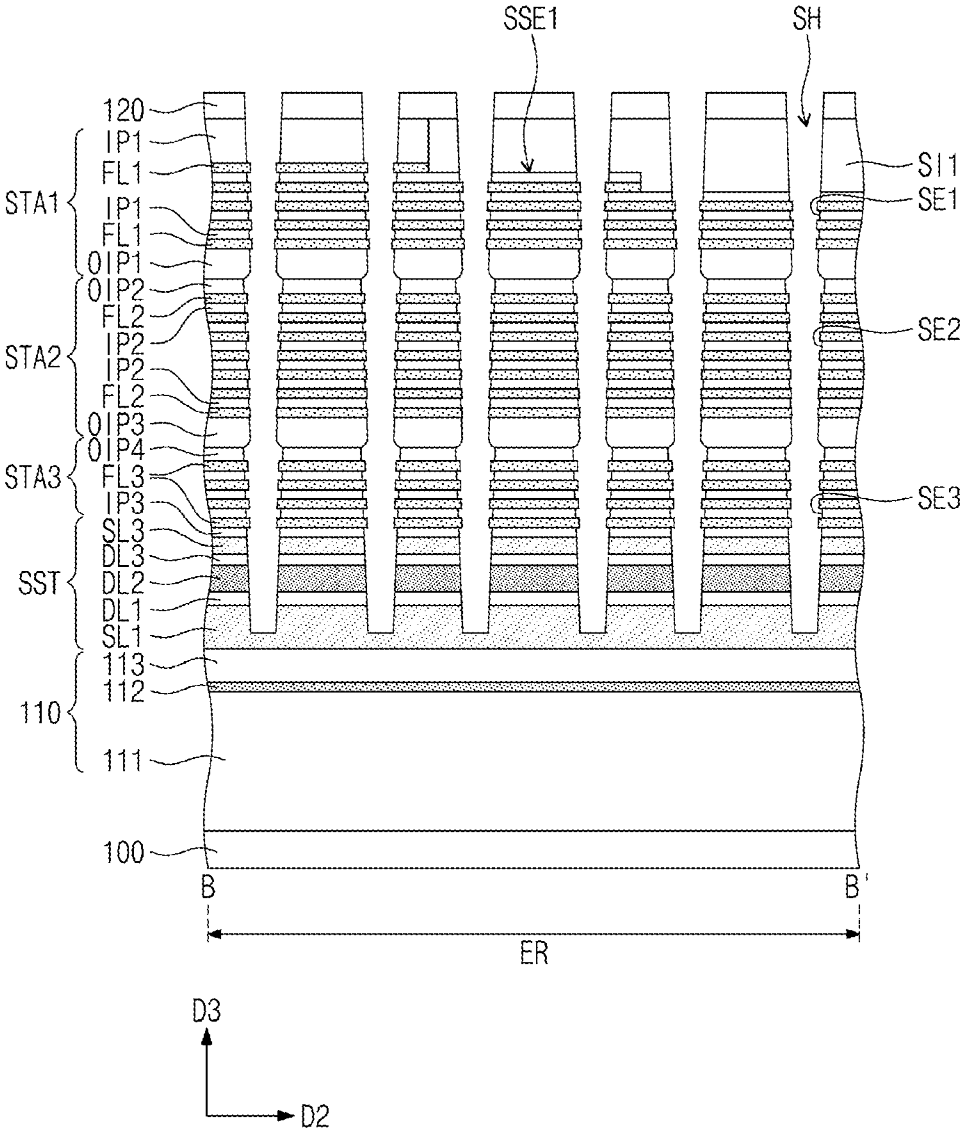
Figure 6C:
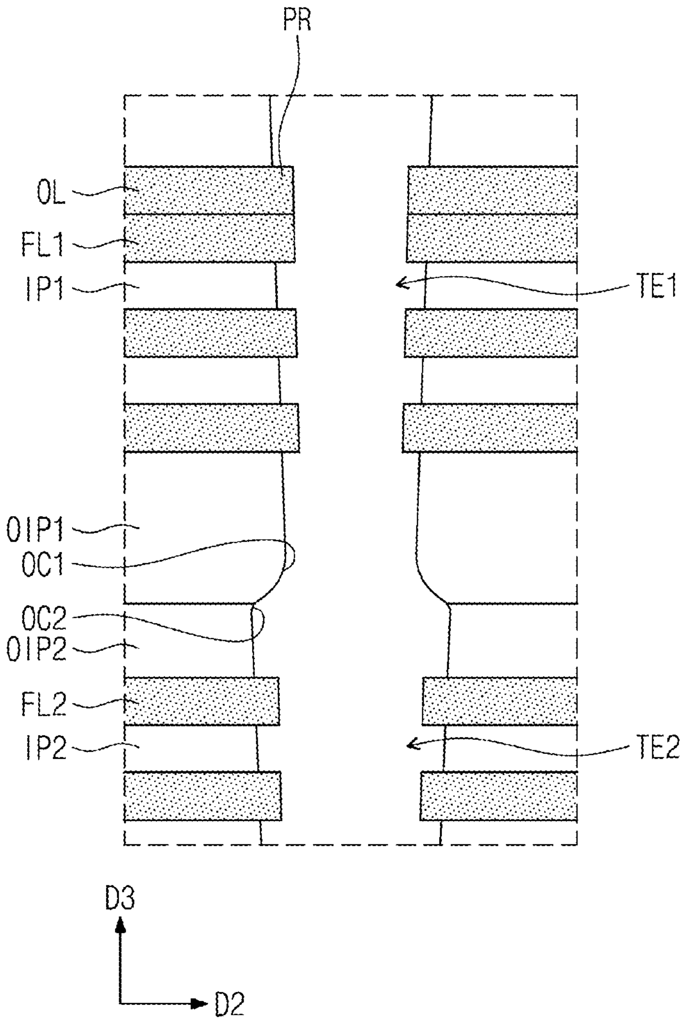
Figure 6D:
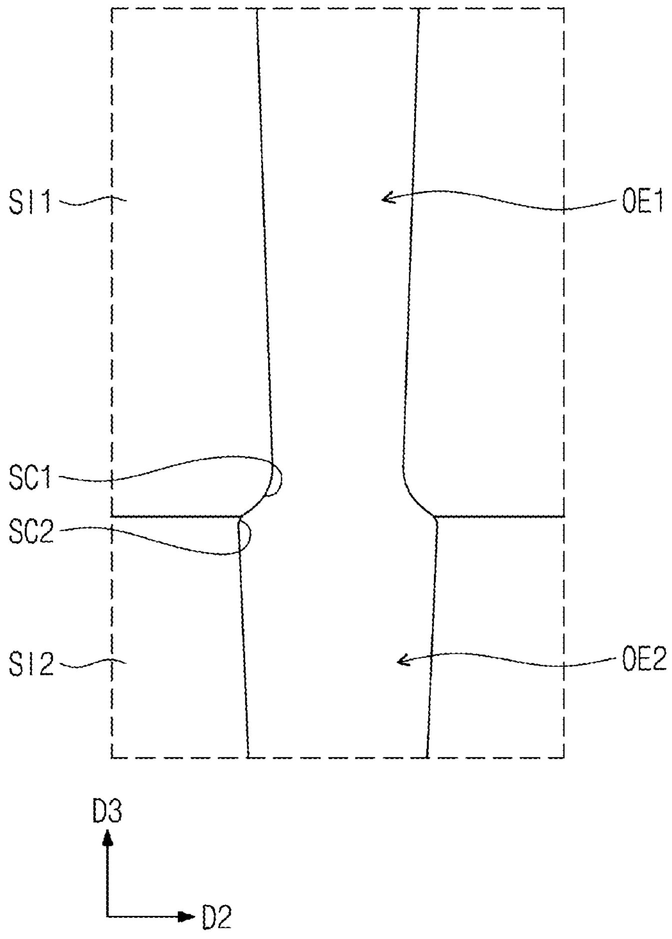
Figure 6E:
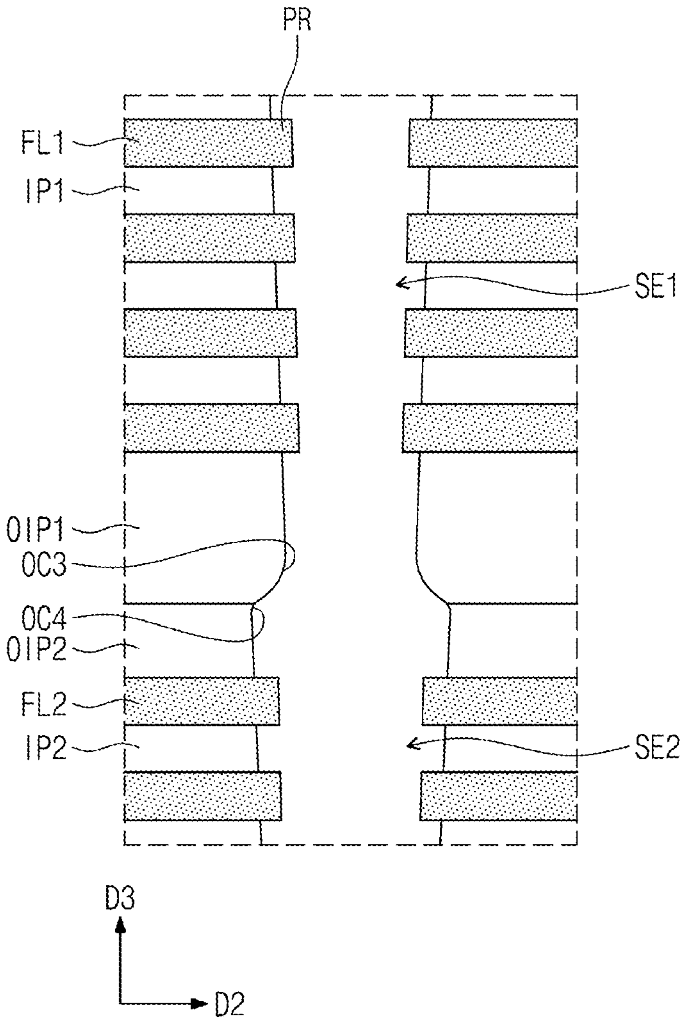
Figure 7A:
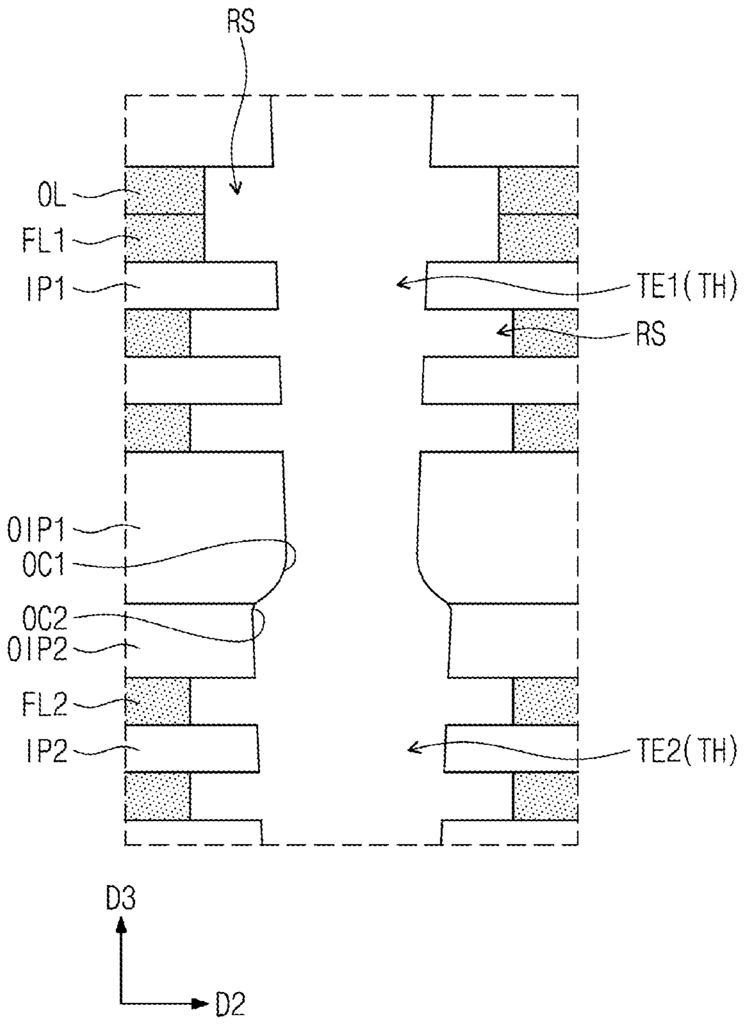
Figure 7B:
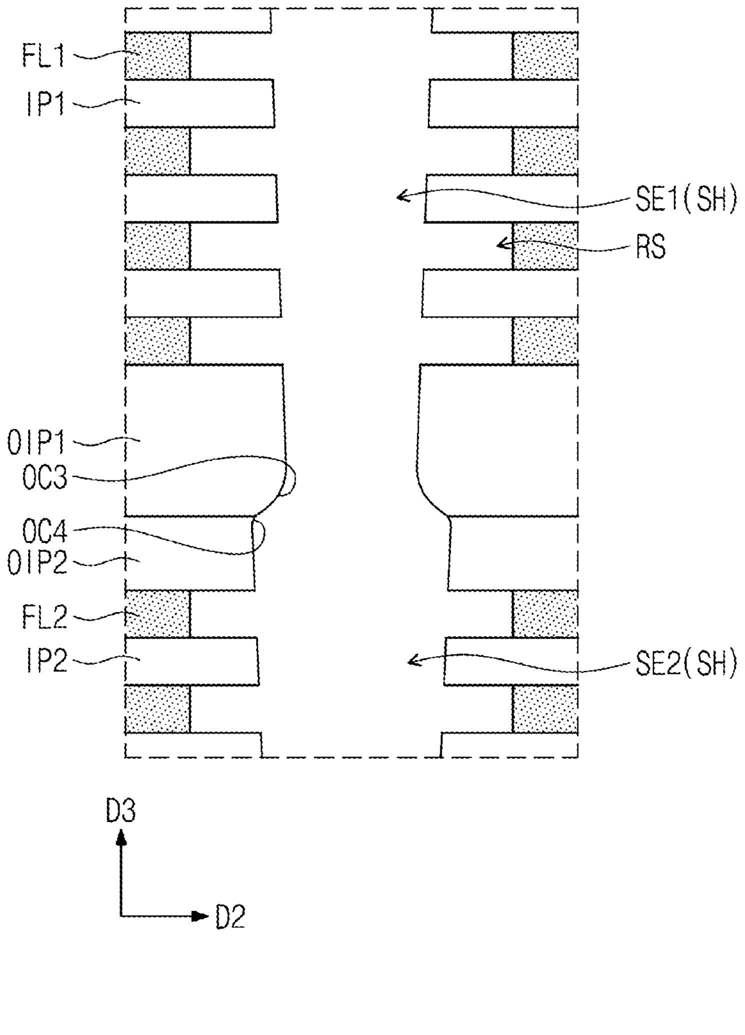

FIGS. 3A, 3B, 4A, 4B, 4C, 4D, 4E, 4F, 5A, 5B, 6A, 6B, 6C, 6D, 6E, 7A, 7B, 8A, and 8B illustrate a method of fabricating a semiconductor device according to some embodiments. FIGS. 3A, 4A, 5A, 6A, and 8A may correspond to FIG. 2B. FIGS. 3B, 4B, 5B, 6B, and 8B may correspond to FIG. 2C. FIG. 4C may correspond to FIG. 2D. FIGS. 4D, 6C, and 7A may correspond to FIG. 2E. FIGS. 4E and 6D may correspond to FIG. 2F. FIGS. 4F, 6E, and 7B may correspond to FIG. 2G.

Figure 3A:
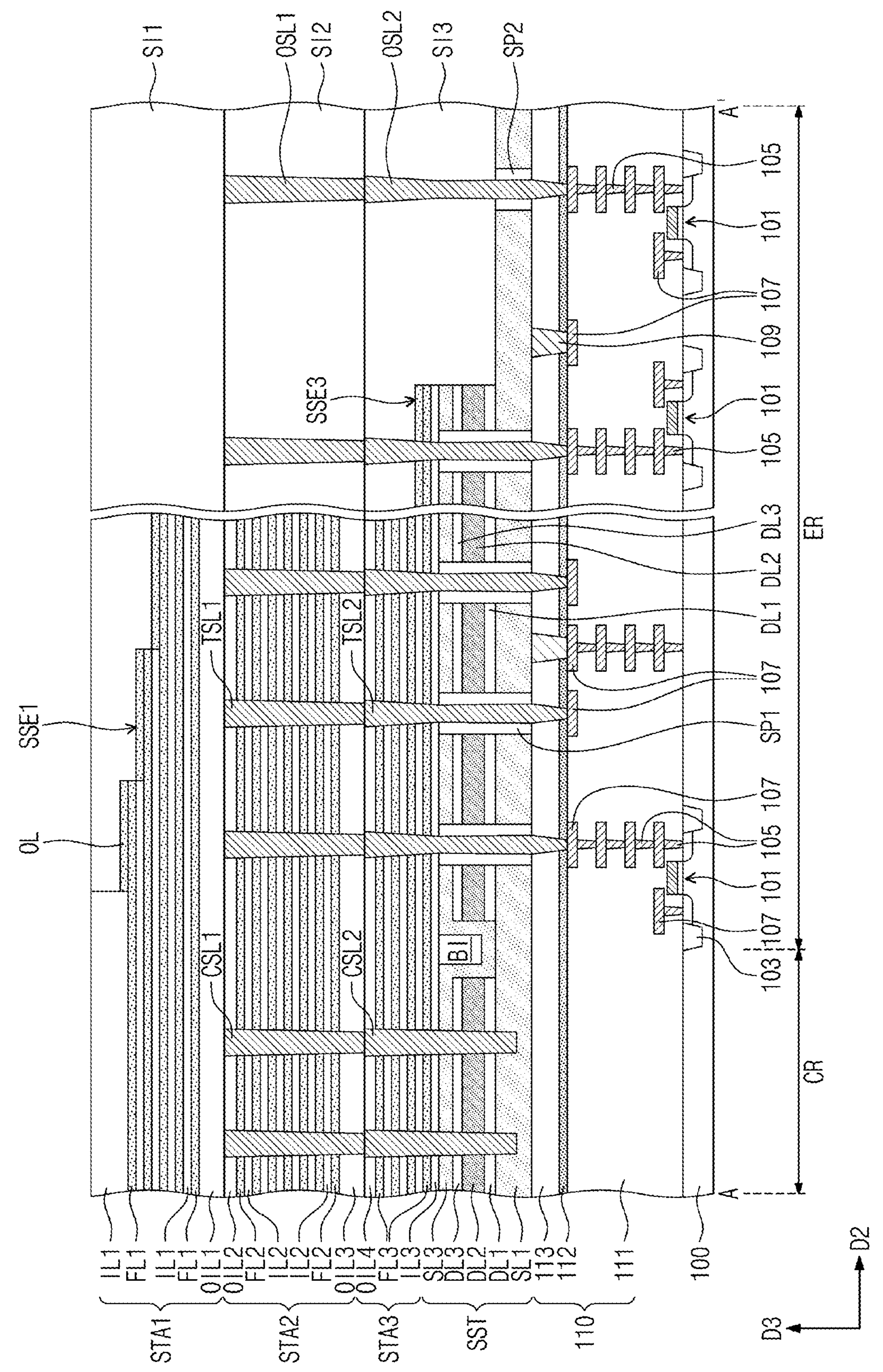
FIGS. 3A, 3B, 4A, 4B, 4C, 4D, 4E, 4F, 5A, 5B, 6A, 6B, 6C, 6D, 6E, 7A, 7B, 8A, and 8B illustrate a method of fabricating a semiconductor device according to some embodiments.
Figure 3B:
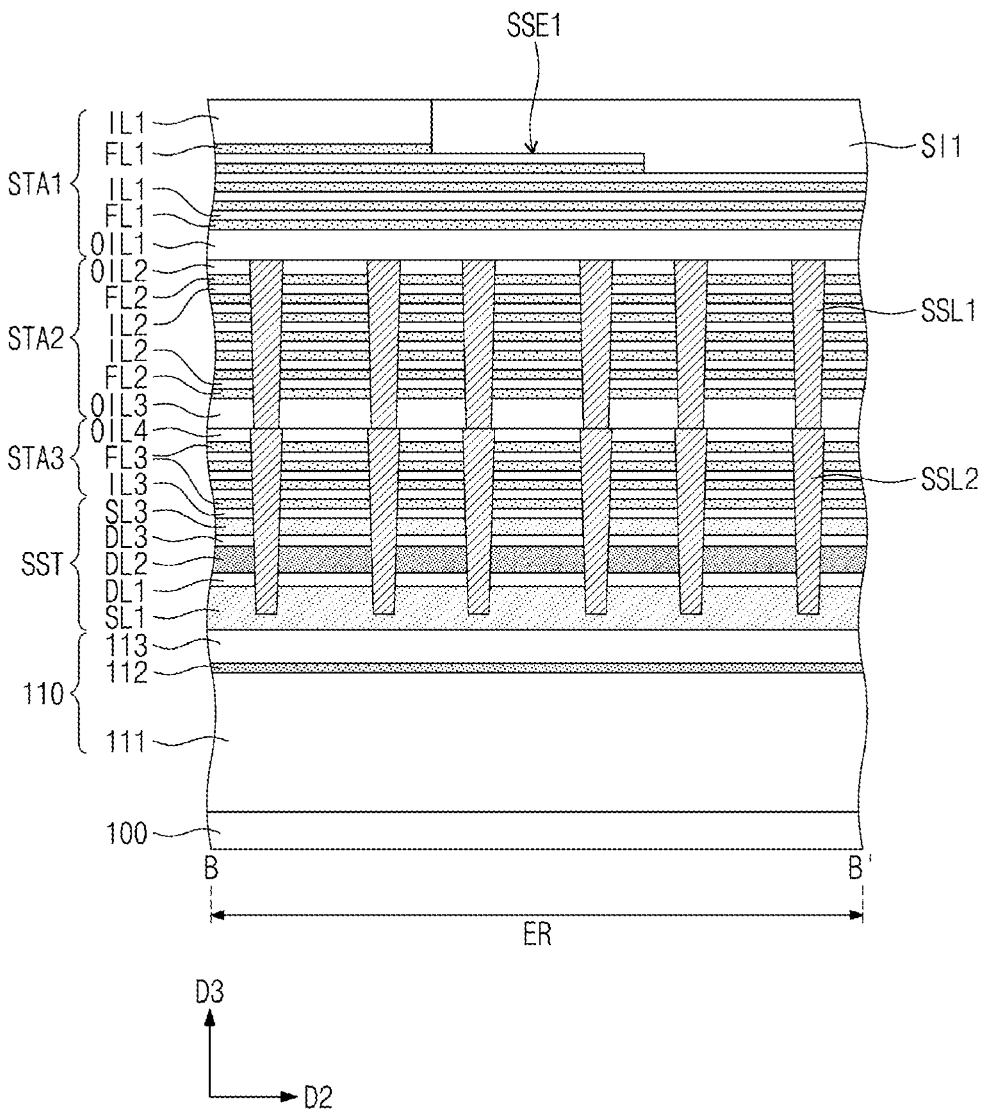
Figure 4A:
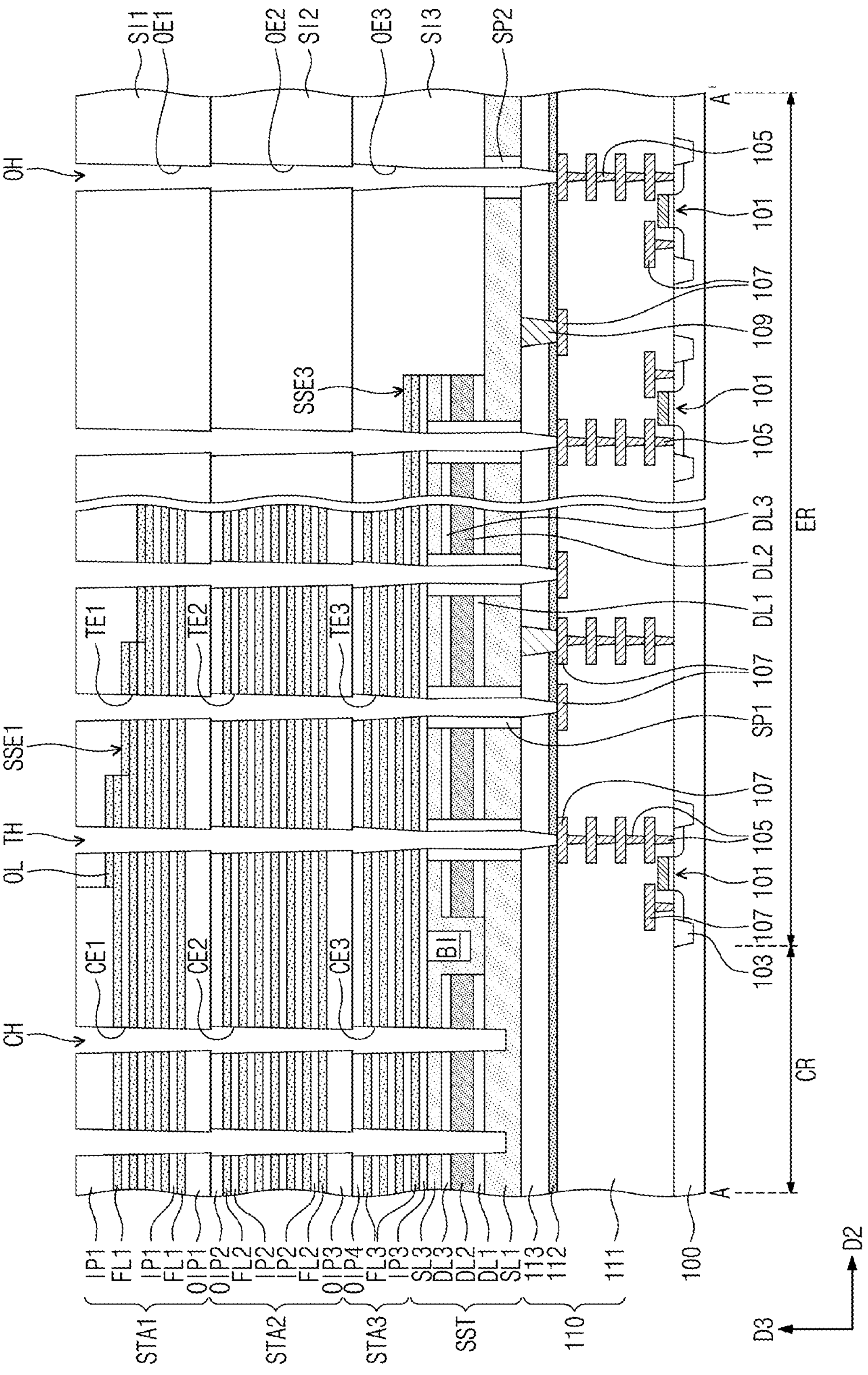
Figure 4B:
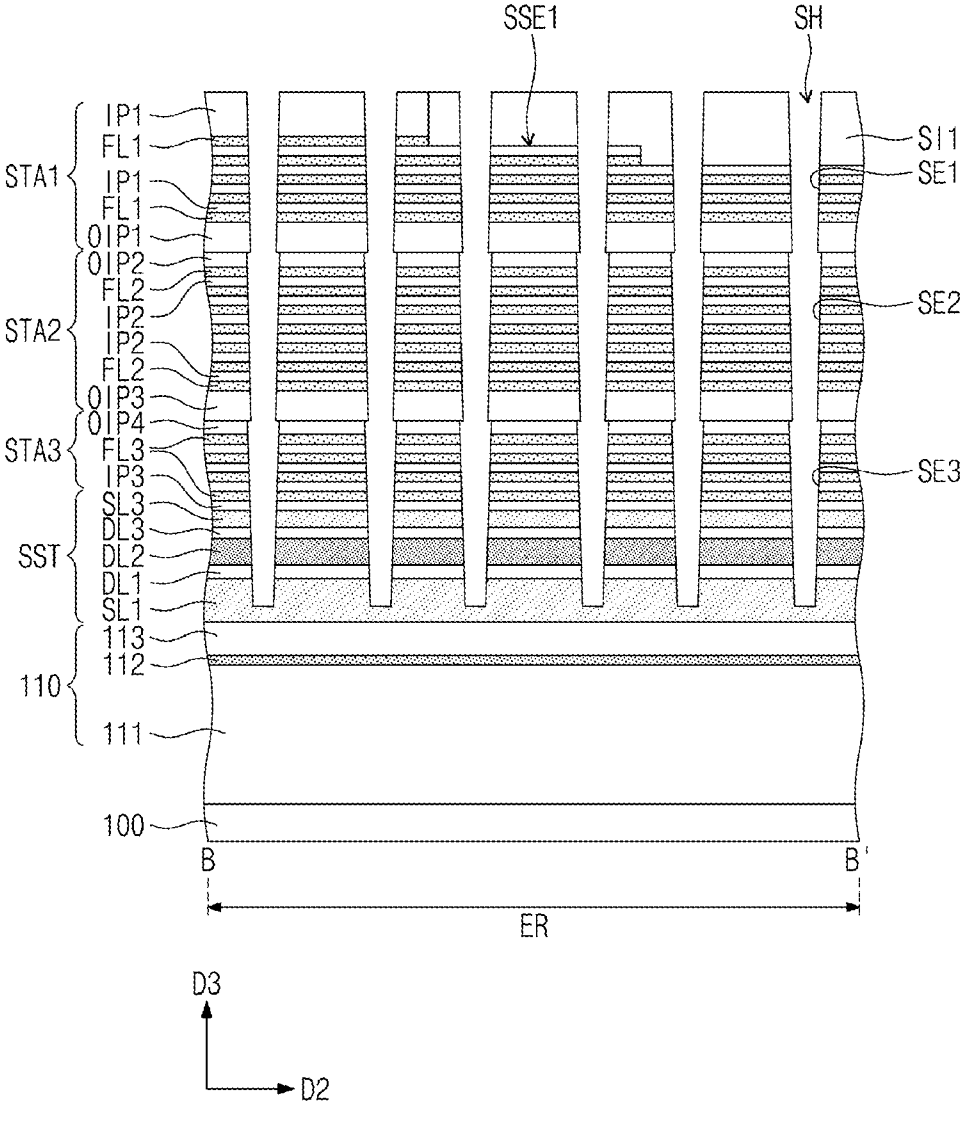
Figure 4C:
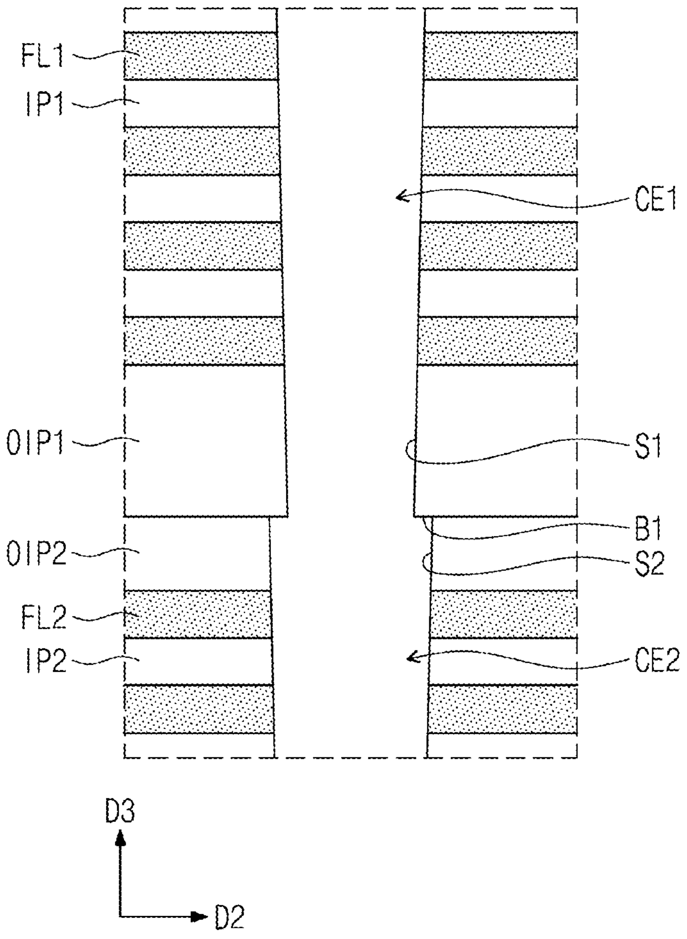
Figure 4D:
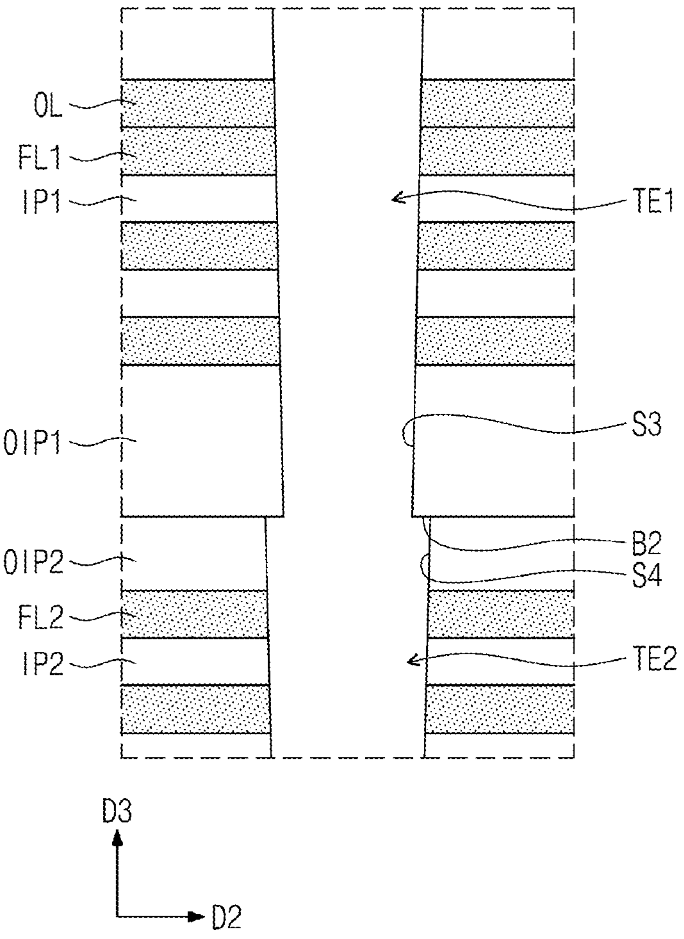
Figure 4E:
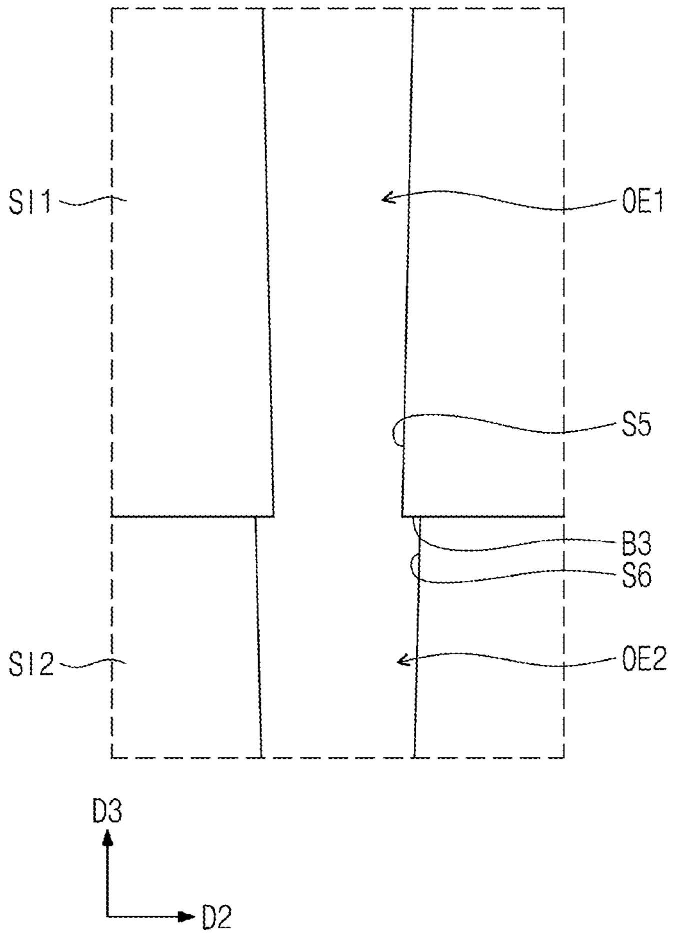
Figure 4F:
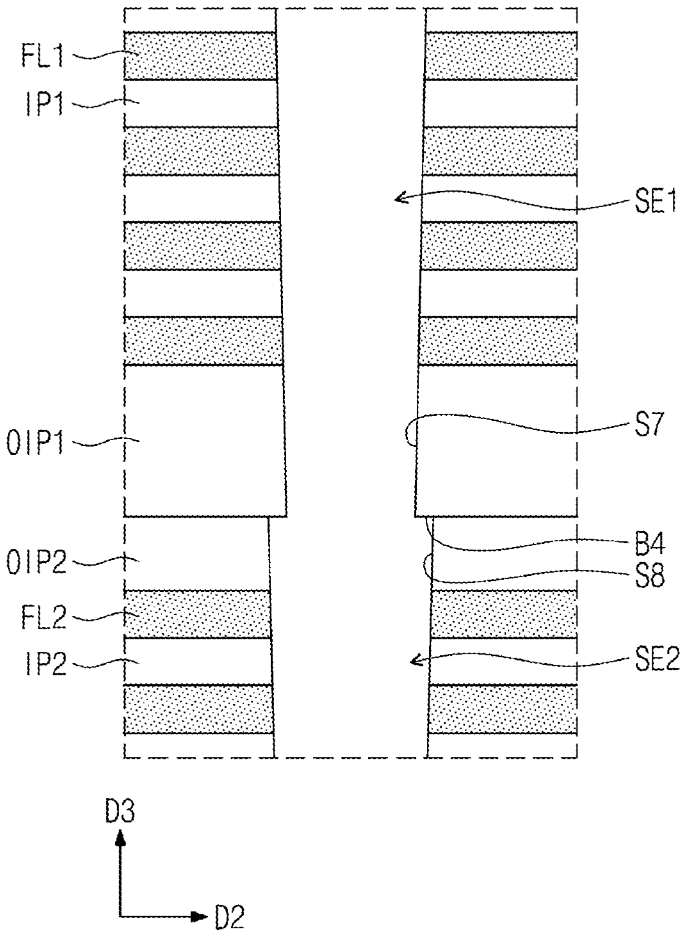

Referring to FIGS. 3A and 3B, a substrate 100 may be provided thereon with peripheral transistors 101, device isolation layers 103, peripheral contacts 105, peripheral conductive lines 107, source connection contacts 109, and a peripheral circuit dielectric structure 110.

A source structure SST may be formed. The formation of the source structure SST may include forming a first source layer SL1, forming on the first source layer SL1 first, second, and third dummy layers DL1, DL2, and DL3 of a cell region CR and first, second, and third dummy layers DL1, DL2, and DL3 of an extension region ER, forming a third source layer SL3, forming a buried dielectric layer BI on the third source layer SL3, and forming first and second source dielectric patterns SP1 and SP2.

A first stack structure STA1, a second stack structure STA2, a third stack structure STA3, a first stepwise dielectric layer SI1, a second stepwise dielectric layer SI2, a third stepwise dielectric layer SI3, first channel sacrificial layers CSL1, second channel sacrificial layers CSL2, first through sacrificial layers TSL1, second through sacrificial layers TSL2, first connection sacrificial layers OSL1, second connection sacrificial layers OSL2, first support sacrificial layers SSL1, and second support sacrificial layers SSL2 may be formed.

The first stack structure STA1 may include may include first dielectric layers IL1 and first sacrificial layers FL1 that are alternately stacked. A first connection dielectric layer OIL1 may be defined as referring to a lowermost one of the first dielectric layers IL1. The second stack structure STA2 may include second dielectric layers IL2 and second sacrificial layers FL2 that are alternately stacked. A second connection dielectric layer OL2 may be defined as referring to an uppermost one of the second dielectric layers IL2. A third connection dielectric layer OIL3 may be defined as referring to a lowermost one of the second dielectric layers IL2. The third stack structure STA3 may include third dielectric layers IL3 and third sacrificial layers FL3 that are alternately stacked. A fourth connection dielectric layer OL4 may be defined as referring to an uppermost one of the third dielectric layers IL3. The first stack structure STA1 may include a first stack stepwise structure SSE1, the second stack structure STA2 may include a second stack stepwise structure, and the third stack structure STA3 may include a third stack stepwise structure SSE3.

The first, second, and third dielectric layers IL1, IL2, and IL3 may include a dielectric material different from that of the first, second, and third sacrificial layers FL1, FL2, and FL3. For example, the first, second, and third dielectric layers IL1, IL2, and IL3 may include an oxide, and the first, second, and third sacrificial layers FL1, FL2, and FL3 may include a nitride.

The third stack structure STA3 may be formed on the source structure SST. The third dielectric layers IL3 and the third sacrificial layers FL3 may be patterned to form the third stack stepwise structure SSE3. The third stepwise dielectric layer SI3 may be formed to cover the third stack stepwise structure SSE3. Before the formation of the third stepwise dielectric layer SI3, an on overlap sacrificial layer OL may be formed on the third sacrificial layer FL3.

The second channel sacrificial layer CSL2, the second through sacrificial layer TSL2, the second connection sacrificial layer OSL2, and the second support sacrificial layer SSL2 that penetrate at least one selected from the third stack structure STA3 and the third stepwise dielectric layer SI3 may be formed.

The second stack structure STA2 may be formed on the third stack structure STA3, and the second dielectric layers IL2 and the second sacrificial layers FL2 may be patterned to form the second stack stepwise structure (not shown). The second stepwise dielectric layer SI2 may be formed to cover the second stack stepwise structure. Before the formation of the second stepwise dielectric layer SI2, an overlap sacrificial layer OL may be formed on the second sacrificial layer FL2.

The first channel sacrificial layer CSL1, the first through sacrificial layer TSL1, the first connection sacrificial layer OSL1, and the first support sacrificial layer SSL1 that penetrate at least one selected from the second stack structure STA2 and the second stepwise dielectric layer SI2 may be formed.

The first stack structure STA1 may be formed on the second stack structure STA2, and the first dielectric layers IL1 and the first sacrificial layers FL1 may be patterned to form the first stack stepwise structure SSE1. The first stepwise dielectric layer SI1 may be formed to cover the first stack stepwise structure SSE1. Before the formation of the first stepwise dielectric layer SI1, an on overlap sacrificial layer OL may be formed on the first sacrificial layer FL1 see (FIG. 6A).

Referring to FIGS. 4A, 4B, 4C, 4D, 4E, and 4F, channel holes CH, through holes TH, connection holes OH, and support holes SH may be formed. The channel hole CH, the through hole TH, the connection hole OH, and the support hole SH may penetrate at least one selected from the first stack structure STA1 and the first stepwise dielectric layer SI1, at least one selected from the second stack structure STA2 and the second stepwise dielectric layer SI2, and at least one selected from the third stack structure STA3 and the third stepwise dielectric layer SI3. In some embodiments, the channel hole CH, the through hole TH, the connection hole OH, and the support hole SH may be formed simultaneously in the same process.

The formation of the channel hole CH may include forming a first channel aperture CE1, opening a second channel aperture CE2, and opening a second channel aperture CE3. The first channel aperture CE1 may be formed to penetrate the first stack structure STA1. The first channel sacrificial layer CSL1 may be removed through the first channel aperture CE1. A space filled with the first channel layer CSL1 may be defined to indicate the second channel aperture CE2. The first channel sacrificial layer CSL1 may be removed to open the second channel aperture CE2. The second channel sacrificial layer CSL2 may be removed through the second channel aperture CE2. A space filled with the second channel layer CSL2 may be defined to indicate the third channel aperture CE3. The second channel sacrificial layer CSL2 may be removed to open the third channel aperture CE3.

The through hole TH may include a first through aperture TE1, a second through aperture TE2, and a third through aperture TE3. The formation of the through hole TH may include removing the first and second through sacrificial layers TSL1 and TSL2.

The connection hole OH may include a first connection aperture OE1, a second connection aperture OE2, and a third connection aperture OE3. The formation of the connection hole OH may include removing the first and second connection sacrificial layers OSL1 and OSL2.

The support hole SH may include a first support aperture SE1, a second support aperture SE2, and a third support aperture SE3. The support hole SH may include removing the first and second support sacrificial layers SSL1 and SSL2.

The first through aperture TE1, the first connection aperture OE1, and the first support aperture SE1 may be located at the same level as the first channel aperture CE1. The second through aperture TE2, the second connection aperture OE2, and the second support aperture SE2 may be located at the same level as the second channel aperture CE2. The third through aperture TE3, the third connection aperture OE3, and the third support aperture SE3 may be located at the same level of the third channel aperture CE3.

While the channel holes CH, the through holes TH, and the support holes SH are formed, the first, second, and third dielectric layers IL1, IL2, and IL2 may be patterned to define first, second, and third dielectric patterns IP1, IP2, and IP3. The first, second, third, and fourth connection dielectric layers OIL, OIL2, OIL3, and OIL4 may be patterned to define first, second, third, and fourth connection dielectric patterns OIP1, OIP2, OIP3, and OIP4.

When viewed in a vertical section, as shown in FIG. 4C, the first connection dielectric pattern OIP1 may be flat on its sidewall S1 exposed by the first channel aperture CE1. When viewed as a vertical section as shown in FIG. 4C, the second connection dielectric pattern OIP2 may be flat on its sidewall S2 exposed by the second channel aperture CE2. When viewed in vertical section as shown in FIG. 4C, the first connection dielectric pattern OIP1 may be flat on its bottom surface B1 exposed by the second channel aperture CE2. The bottom surface B1 of the first connection dielectric pattern OIP1 exposed by the second channel aperture CE2 may connect the sidewall S1 of the first connection dielectric pattern OIP1 that is exposed by the first channel aperture CE1 to the sidewall S2 of the second connection dielectric pattern OIP2 exposed by the second channel aperture CE2.

When viewed in a vertical section as shown in FIG. 4D, the first connection dielectric pattern OIP1 may be flat on its sidewall S3 exposed by the first through aperture TE1. When viewed in vertical section as shown in FIG. 4D, the second connection dielectric pattern OIP2 may be flat on its sidewall S4 exposed by the second through aperture TE2. When viewed in vertical section as shown in FIG. 4D, the first connection dielectric pattern OIP1 may be flat on its bottom surface B2 exposed by the second through aperture TE2. The bottom surface B2 of the first connection dielectric pattern OIP1 exposed by the second through aperture TE2 may connect the sidewall S3 of the first connection dielectric pattern OIP1 exposed by the first through aperture TE1 to the sidewall S4 of the second connection dielectric pattern OIP2 exposed by the second through aperture TE2.

When viewed in a vertical section as shown in FIG. 4E, the first stepwise dielectric layer SI1 may be flat on its sidewall S5 exposed by the first connection aperture OE1. When viewed in the vertical section as shown in FIG. 4E, the second stepwise dielectric layer SI2 may be flat on its sidewall S6 exposed by the second connection aperture OE2. When viewed in vertical section as shown in FIG. 4E, the first stepwise dielectric layer SI1 may be flat on its bottom surface B3 exposed by the second connection aperture OE2. The bottom surface B3 of the first stepwise dielectric layer SI1 exposed by the second connection aperture OE2 may connect the sidewall S5 of the first stepwise dielectric layer SI1 exposed by the first connection aperture OE1 to the sidewall S6 of the second stepwise dielectric layer SI2 exposed by the second connection aperture OE2.

When viewed in a vertical section as shown in FIG. 4F, the first connection dielectric pattern OIP1 may be flat on its sidewall S7 exposed by the first support aperture SE1. When viewed in the vertical section as shown in FIG. 4F, the second connection dielectric pattern OIP2 may be flat on its sidewall S8 exposed by the second support aperture SE2. When viewed in vertical section as shown in FIG. 4F, the first connection dielectric pattern OIP1 may be flat on its bottom surface B4 exposed by the second support aperture SE2. The bottom surface B4 of the first connection dielectric pattern OIP1 exposed by the second support aperture SE2 may connect the sidewall S7 of the first connection dielectric pattern OIP1 exposed by the first support aperture SE1 to the sidewall S8 of the second connection dielectric pattern OIP2 exposed by the second support aperture SE2.

Figure 5A:
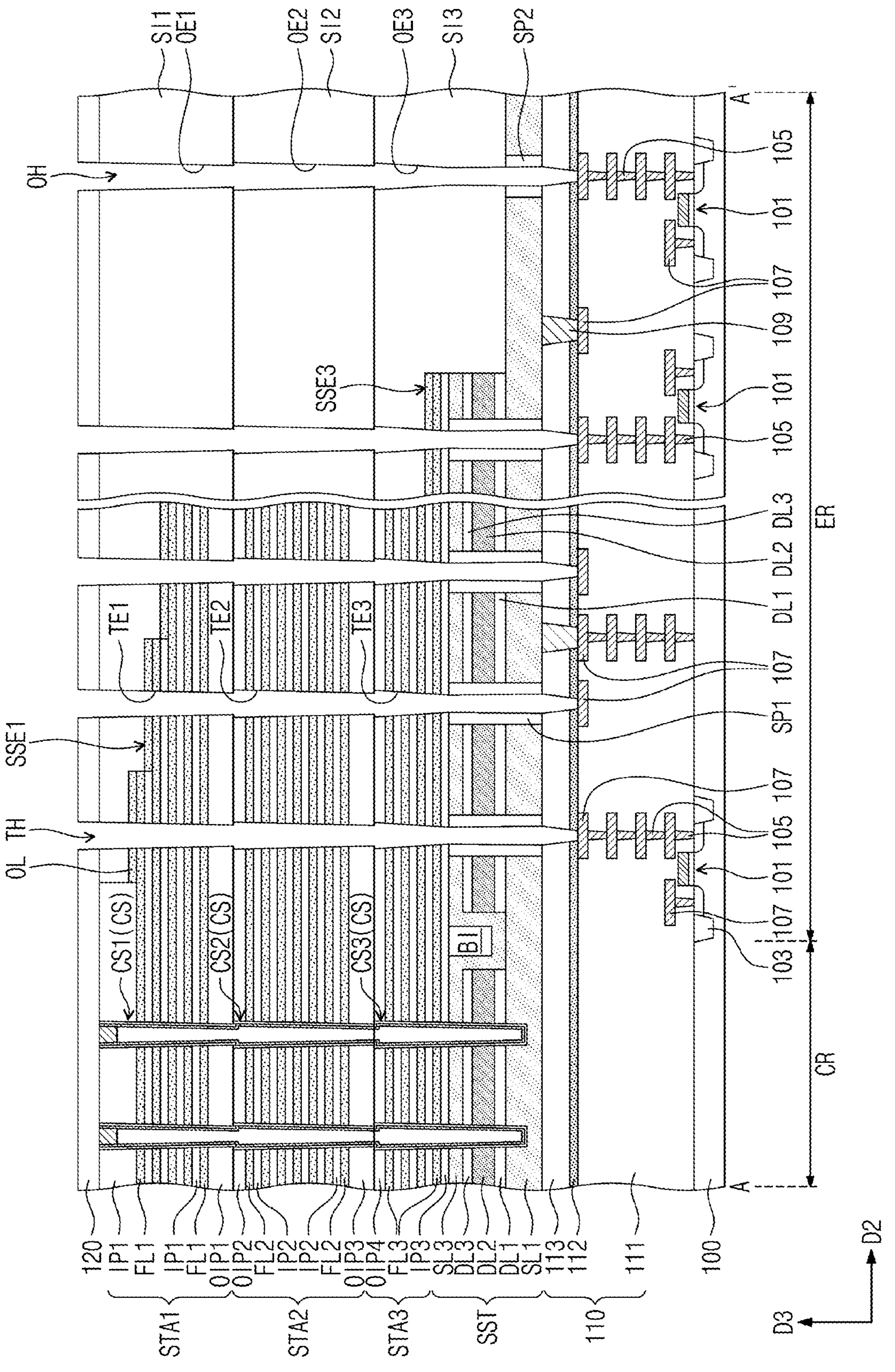
Figure 5B:
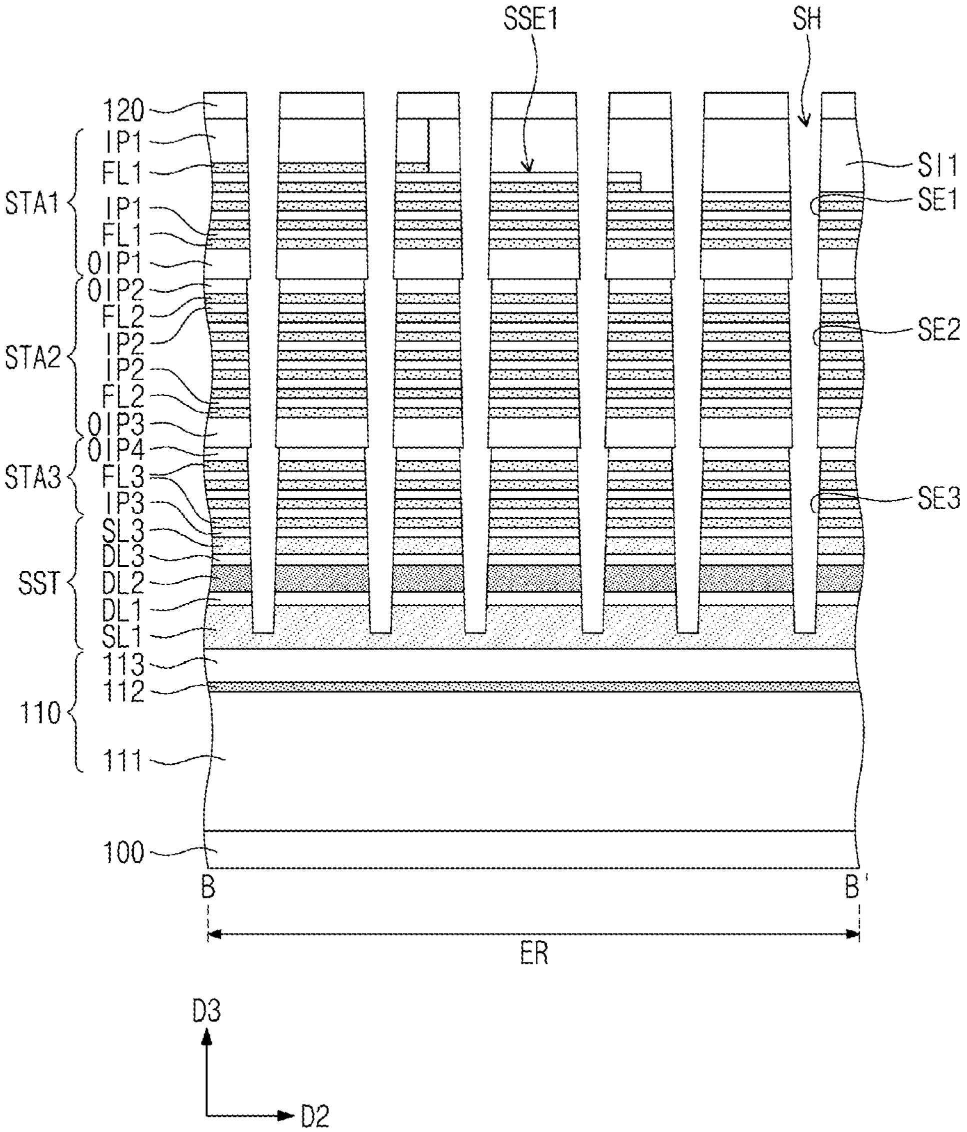

Referring to FIGS. 5A and 5B, a memory channel structure CS may be formed in the channel hole CH. A first memory portion CS1 may be formed in the first channel aperture CE1, a second memory portion CS2 may be formed on the second channel aperture CE2, and a third memory portion CS3 may be formed on the third channel aperture CE3.

A first cover dielectric layer 120 may be formed on the memory channel structures CS and the first stepwise dielectric layer SI1. The first cover dielectric layer 120 may be patterned to expose the through holes TH, the connection holes OH, and the support holes SH. In some embodiments, before the formation of the memory channel structures CS, sacrificial layers may be formed to fill the through holes TH, the connection holes OH, and the support holes SH, and the sacrificial layers may be removed after the first cover dielectric layer 120 is patterned.

Referring to FIGS. 6A, 6B, 6C, 6D, and 6E, the through holes TH, the connection holes OH, and the support holes SH may be expanded. For example, the through holes TH, the connection holes OH, and the support holes SH may be expanded by selectively etching the first, second, and third dielectric patterns IP1, IP2, and IP3 and the first, second, and third stepwise dielectric layers SI1, SI2, and SI3 exposed by the through holes TH, the connection holes OH, and the support holes SH. The process of expanding the through holes TH, the connection holes OH, and the support holes SH may be, for example, a process that selectively etches oxides.

When the first, second, and third dielectric patterns IP1, IP2, and IP3 are selectively etched, each of the overlap sacrificial layers OL and the first, second, and third sacrificial layers FL1, FL2, and FL3 may include a protrusion PR that protrudes toward the through hole TH or the support hole SH.

The sidewall S3 of the first connection dielectric pattern OIP1 exposed by the first through aperture TE1 and the bottom surface B2 of the first connection dielectric pattern OIP1 exposed by the second through aperture TE2 may be etched to form a first connection dielectric curved surface OC1 of the first connection dielectric pattern OIP1. The sidewall S4 of the second connection dielectric pattern OIP2 exposed by the second through aperture TE2 may be etched to form a second connection dielectric curved surface OC2 of the second connection dielectric pattern OIP2.

The sidewall S5 of the first stepwise dielectric layer SI1 exposed by the first connection aperture OE1 and the bottom surface B3 of the first stepwise dielectric layer SI1 exposed by the second connection aperture OE2 may be etched to form a first stepwise dielectric curved surface SC1 of the first stepwise dielectric layer SI1. The sidewall S6 of the second stepwise dielectric layer SI2 exposed by the second connection aperture OE2 may be etched to form a second stepwise dielectric curved surface SC2 of the second stepwise dielectric layer SI2.

The sidewall S7 of the first connection dielectric pattern OIP1 exposed by the first support aperture SE1 and the bottom surface B4 of the first connection dielectric pattern OIP1 exposed by the second through aperture TE2 may be etched to form a third connection dielectric curved surface OC3 of the first connection dielectric pattern OIP1. The sidewall S8 of the second connection dielectric pattern OIP2 exposed by the second support aperture SE2 may be etched to form a fourth connection dielectric curved surface OC4 of the second connection dielectric pattern OIP2. The expansion of the through holes TH, the connection holes OH, and the support holes SH may cause each of the through hole TH, the connection hole OH, and the support hole SH to have a width greater than that of the channel hole CH.

Referring to FIGS. 7A and 7B, the first, second, and third sacrificial layers FL1, FL2, and FL3 may be selectively etched, and the overlap sacrificial layers OL may also be selectively etched. For example, the first, second, and third sacrificial layers FL1, FL2, and FL3 and the overlap sacrificial layers OL may be etched by a pullback process that selectively etches nitrides.

The first, second, and third sacrificial layers FL1, FL2, and FL3 and the overlap sacrificial layers OL may be selectively etched to form recesses RS. The recess RS may be defined to refer to an empty space provided between neighboring ones of the first, second, and third dielectric patterns IP1, IP2, and IP3. The recess RS may be connected to the through hole TH or the support hole SH.

Figure 8A:
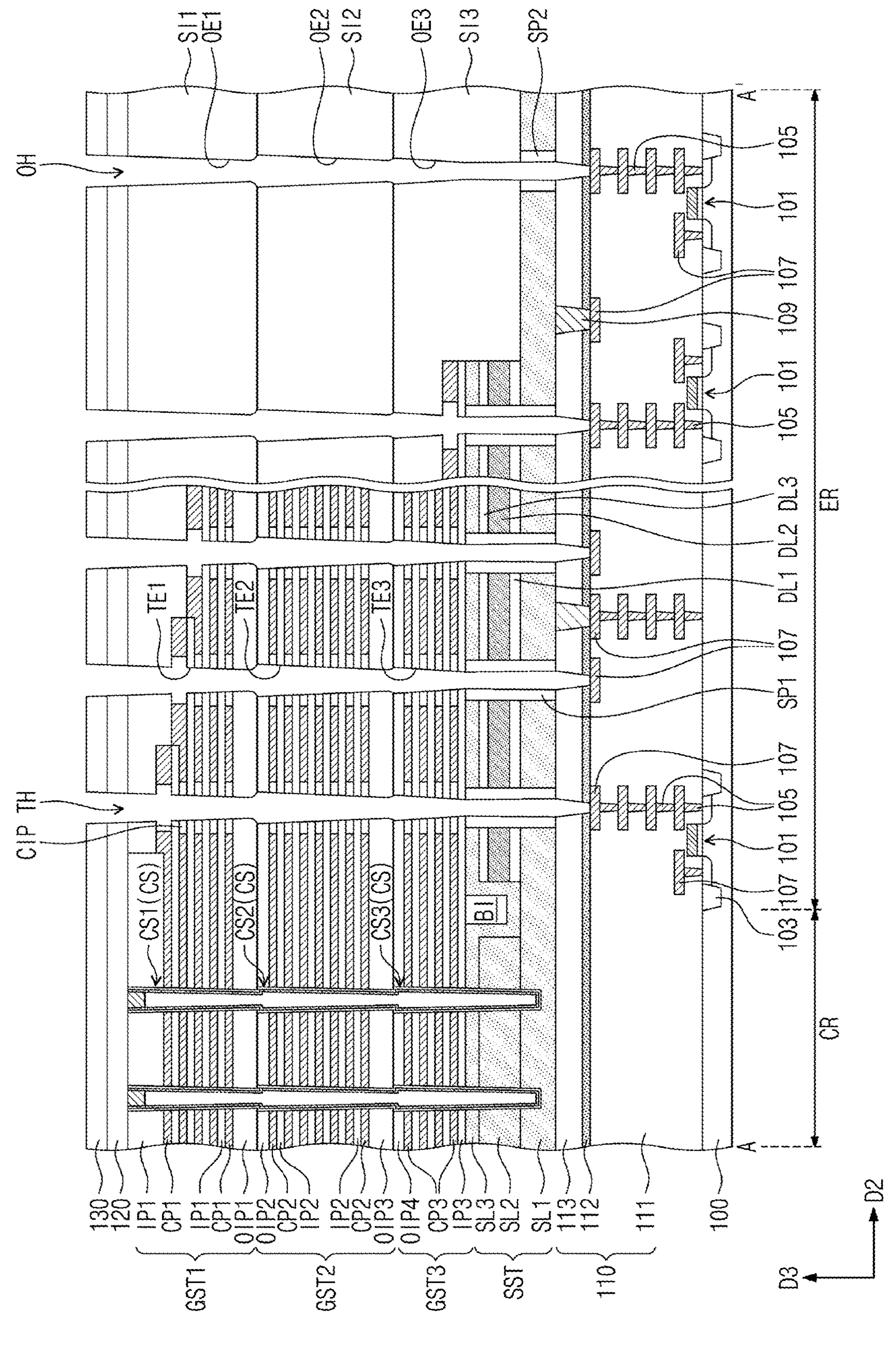
Figure 8B:
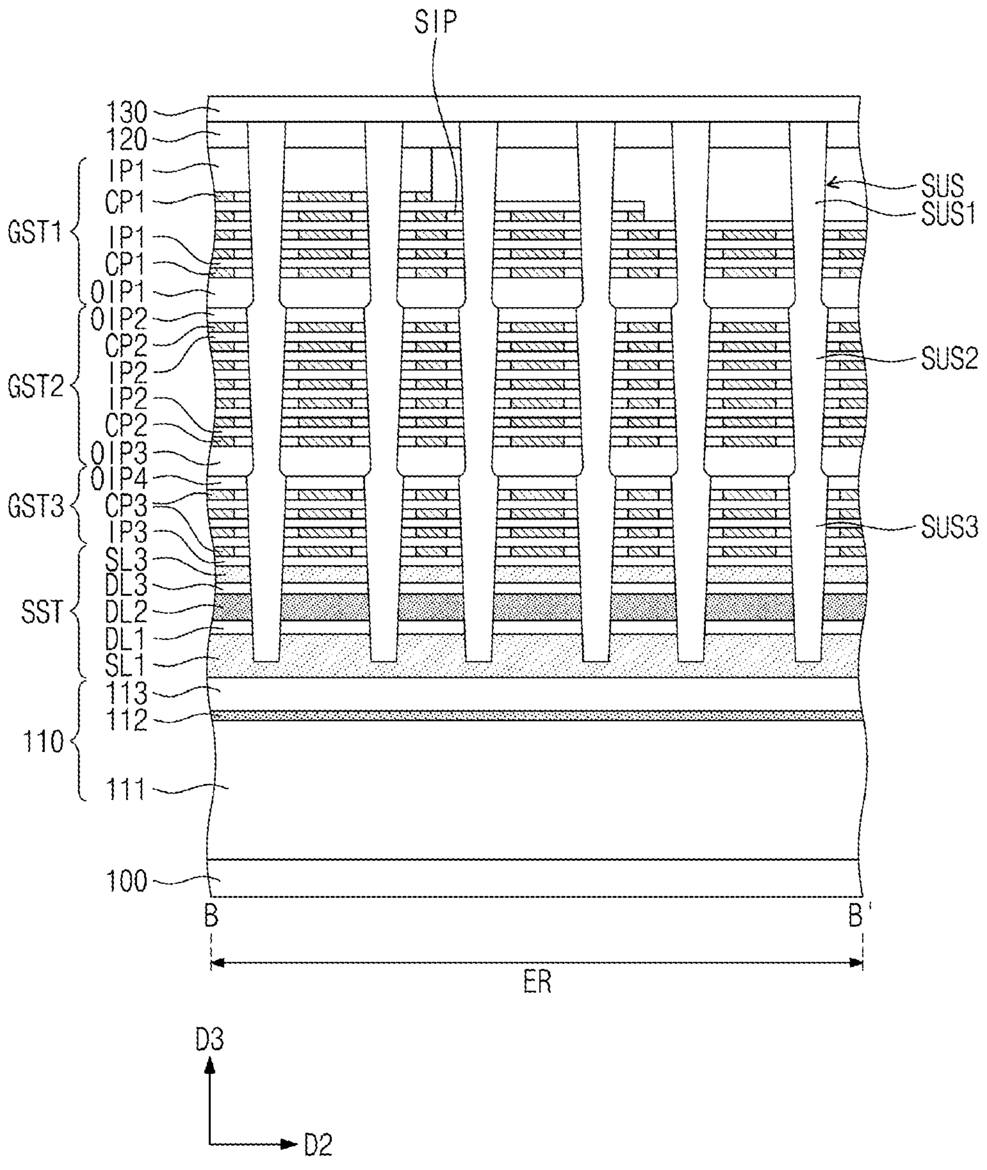

Referring to FIGS. 8A and 8B, contact dielectric patterns CIP and support dielectric patterns SIP may be formed in the recesses RS. Support structures SUS may be formed in the support holes SH.

A second source layer SL2 may be formed. The first, second, and third sacrificial layers FL1, FL2, and FL3 and the overlap sacrificial layers OL may be replaced with first, second, and third conductive patterns CP1, CP2, and CP3. The formation of the first, second, and third conductive patterns CP1, CP2, and CP3 may define first, second, and third stack structures GST1, GST2, and GST3. Separation structures (see DS of FIG. 2A) may be formed.

A second cover dielectric layer 130 may be formed on the support structures SUS and the first cover dielectric layer 120. The second cover dielectric layer 130 may be patterned to expose the through holes TH and the connection holes OH. In some embodiments, before the formation of the support structures SUS, sacrificial layers may be formed to fill the through holes TH and the connection holes OH. The sacrificial layers may be removed after the second cover dielectric layer 130 is patterned.

Referring back to FIGS. 2A, 2B, 2C, 2D, 2E, 2F, and 2G, through contacts TC may be formed in the through holes TH, and connection contacts CC may be formed in the connection holes OH. A third cover dielectric layer 140 may be formed on the through contacts TC, the connection contacts CC, and the second cover dielectric layer 130. First and second contacts 161 and 163 may be formed. A fourth cover dielectric layer 150 may be formed on the third cover dielectric layer 140. Bit lines 165 and conductive lines 167 may be formed.

In a method of fabricating a semiconductor device according to some embodiments, the expansion process of the through hole TH, the support hole SH, and the connection hole OH may be included to relatively reduce a time required for performing the pullback process on the first, second, and third sacrificial layers FL1, FL2, and FL3 and to prevent the through contact TC and the connection contact CC from abnormal growth that could be caused by the pullback process.

Figure 9:
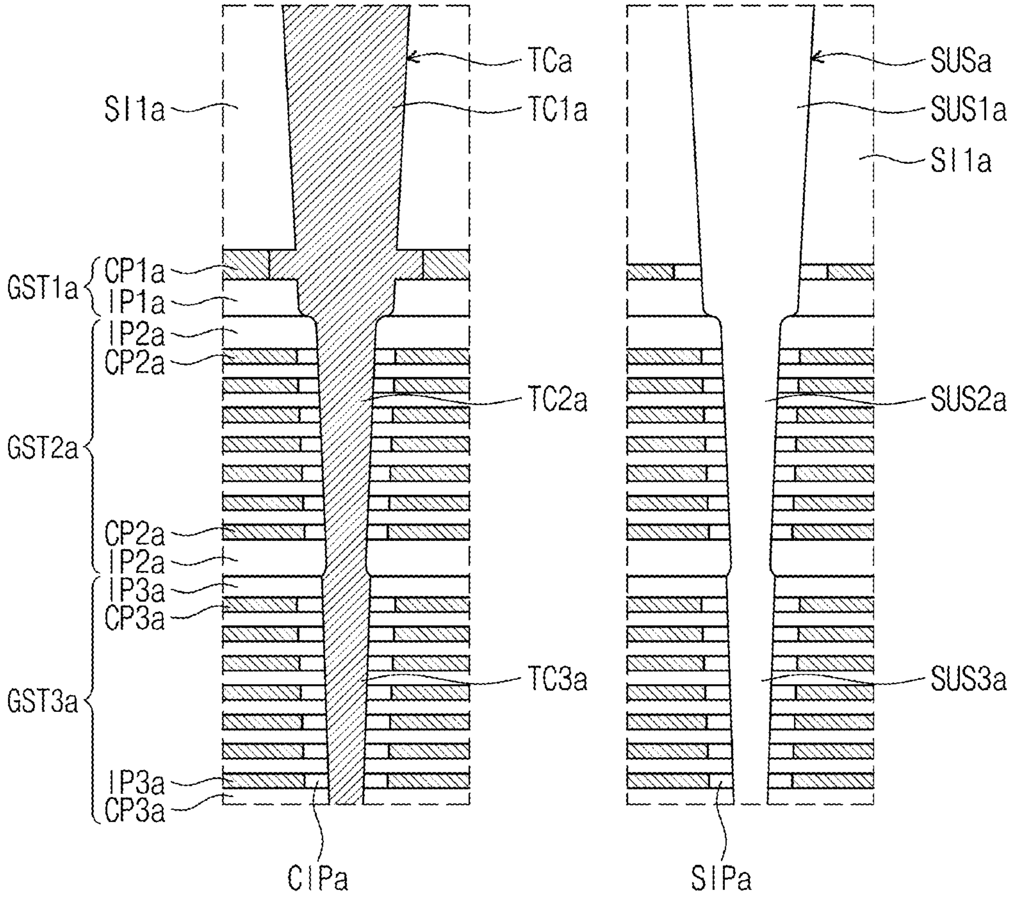
FIG. 9 illustrates a cross-sectional view showing a through contact and a support structure of a semiconductor device according to some embodiments.

FIG. 9 illustrates a cross-sectional view showing a through contact and a support structure of a semiconductor device according to some embodiments.

Referring to FIG. 9, a semiconductor device may include a first gate stack structure GST1*a*, a second gate stack structure GST2*a*, a third gate stack structure GST3*a*, a through contact TCa, a support structure SUSa, and a first stepwise dielectric layer SI1*a*.

The first gate stack structure GST1*a* may include a first conductive pattern CP1*a* and a first dielectric pattern IP1*a*. The second gate stack structure GST2*a* may include a second conductive pattern CP2*a* and a second dielectric pattern IP2*a*. The third gate stack structure GST3*a* may include a third conductive pattern CP3*a* and a third dielectric pattern IP3*a*.

Each of the first, second, and third gate stack structures GST1*a*, GST2*a*, and GST3*a* may include a contact dielectric pattern CIPa that surrounds the through contact TCa and a support dielectric pattern SIPa that surrounds the support structure SUSa.

The first stepwise dielectric layer SI1*a* may cover a stepwise structure of the first gate stack structure GST1*a*. At least a portion of the first stepwise dielectric layer SI1*a* may be disposed on the first gate stack structure GST1*a*.

The through contact TCa may include a first through portion TC1*a* that penetrates the first gate stack structure GST1*a* and the first stepwise dielectric layer SI1*a*, a second through portion TC2*a* that penetrates the second gate stack structure GST2*a*, and a third through portion TC3*a* that penetrates the second through portion TC2*a*.

A minimum width of the first through portion TC1*a* may be greater than a maximum width of the second through portion TC2*a* and a maximum width of the third through portion TC3*a*. For example, a minimum width in the second direction D2 of the first through portion TC1*a* may be greater than a maximum width in the second direction D2 of the second through portion TC2*a* and a maximum width in the second direction D2 of the third through portion TC3*a*.

The support structure SUSa may be one of support structures that is most adjacent to the through contact TCa. The support structure SUSa may include a first support portion SUS1*a* that penetrates the first gate stack structure GST1*a* and the first stepwise dielectric layer SI1*a*, a second support portion SUS2*a* that penetrates the second gate stack structure GST2*a*, and a third support portion SUS3*a* that penetrates the third gate stack structure GST3*a*.

A minimum width of the first support portion SUS1*a* may be greater than a maximum width of the second support portion SUS2*a* and a maximum width of the third support portion SUS3*a*. For example, a maximum width in the second direction D2 of the first support portion SUS1*a* may be greater than a maximum width in the second direction D2 of the second support portion SUS2*a* and a maximum width in the second direction D2 of the third support portion SUS3*a*.

Figure 10:
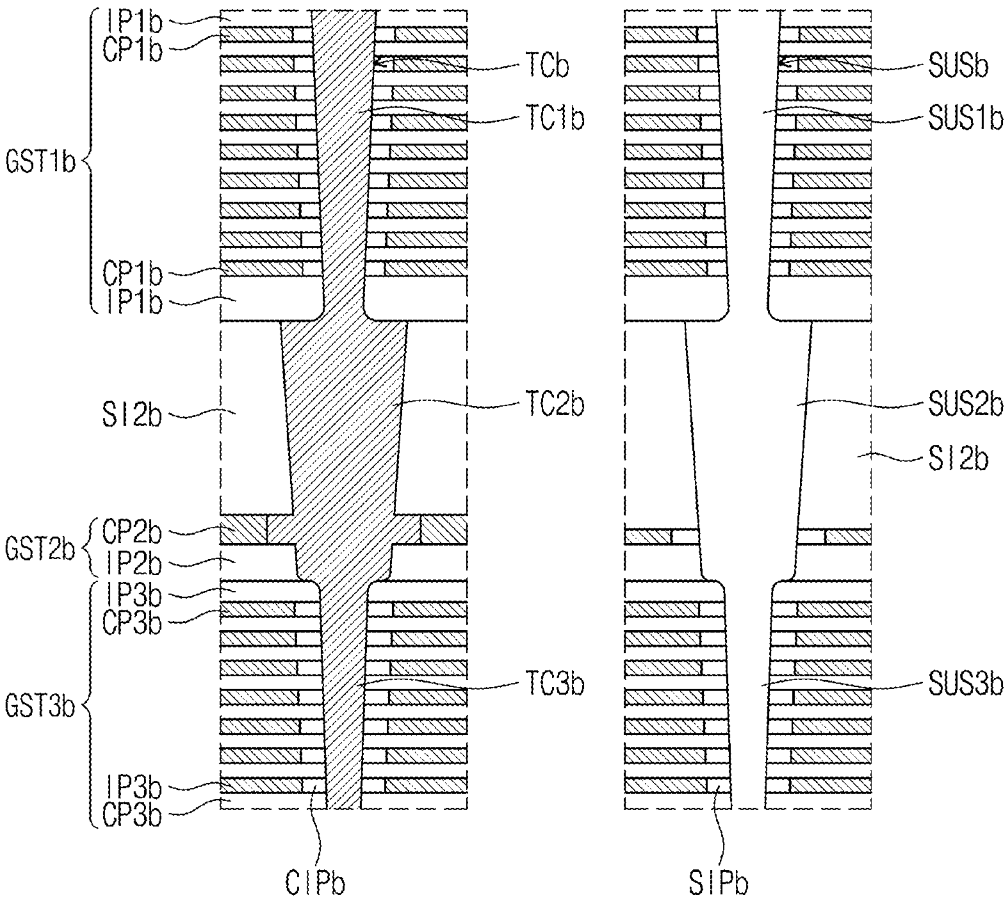
FIG. 10 illustrates a cross-sectional view showing a through contact and a support structure of a semiconductor device according to some embodiments.

FIG. 10 illustrates a cross-sectional view showing a through contact and a support structure of a semiconductor device according to some embodiments.

Referring to FIG. 10, a semiconductor device may include a first gate stack structure GST1*b*, a second gate stack structure GST2*b*, a third gate stack structure GST3*b*, a through contact TCb, a support structure SUSb, and a second stepwise dielectric layer SI2*b*.

The first gate stack structure GST1*b* may include a first conductive pattern CP1*b* and a first dielectric pattern IP1*b*. The second gate stack structure GST2*b* may include a second conductive pattern CP2*b* and a second dielectric pattern IP2*b*. The third gate stack structure GST3*b* may include a third conductive pattern CP3*b* and a third dielectric pattern IP3*b*.

Each of the first, second, and third gate stack structures GST1*b*, GST2*b*, and GST3*b* may include a contact dielectric pattern CIPb that surrounds the through contact TCb and a support dielectric pattern SIPb that surrounds the support structure SUSb.

The second stepwise dielectric layer SI2*b* may cover a stepwise structure of the second gate stack structure GST2*b*. At least a portion of the second stepwise dielectric layer SI2*b* may be disposed between the first gate stack structure GST1*b* and the second gate stack structure GST2*b*.

The through contact TCb may include a first through portion TC1*b* that penetrates the first gate stack structure GST1*b*, a second through portion TC2*b* that penetrates the second gate stack structure GST2*b* and the second stepwise dielectric layer SI2*b*, and a third through portion TC3*b* that penetrates the third gate stack structure GST3*b*.

A minimum width of the second through portion TC2*b* may be greater than a maximum width of the first through portion TC1*b* and a maximum width of the third through portion TC3*b*. For example, a minimum width in the second direction D2 of the second through portion TC2*b* may be greater than a maximum width in the second direction D2 of the first through portion TC1*b* and a maximum width in the second direction D2 of the third through portion TC3*b*.

The support structure SUSb may be one of support structures that is most adjacent to the through contact TCb. The support structure SUSb may include a first support portion SUS1*b* that penetrates the first gate stack structure GST1*b*, a second support portion SUS2*b* that penetrates the second gate stack structure GST2*b* and the second stepwise dielectric layer SI2*b*, and a third support portion SUS3*b* that penetrates the third gate stack structure GST3*b*.

A minimum width of the second support portion SUS2*b* may be greater than a maximum width of the first support portion SUS1*b* and a maximum width of the third support portion SUS3*b*. For example, a maximum width in the second direction D2 of the second support portion SUS2*b* may be greater than a maximum width in the second direction D2 of the first support portion SUS1*b* and a maximum width in the second direction D2 of the third support portion SUS3*b*.

Figure 11:
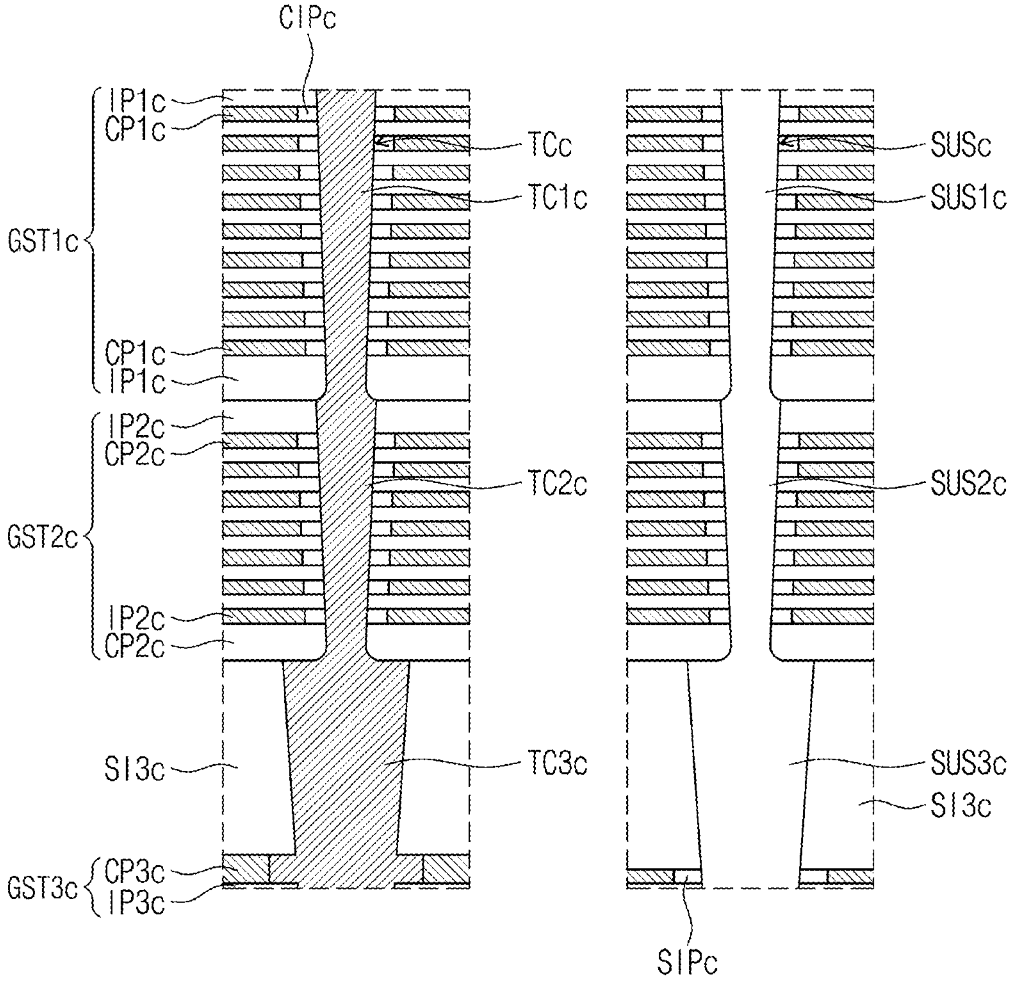
FIG. 11 illustrates a cross-sectional view showing a through contact and a support structure of a semiconductor device according to some embodiments.

FIG. 11 illustrates a cross-sectional view showing a through contact and a support structure of a semiconductor device according to some embodiments.

Referring to FIG. 11, a semiconductor device may include a first gate stack structure GST1*c*, a second gate stack structure GST2*c*, a third gate stack structure GST3*c*, a through contact TCc, a support structure SUSc, and a third stepwise dielectric layer SI3*c*.

The first gate stack structure GST1*c* may include a first conductive pattern CP1*c* and a first dielectric pattern IP1*c*. The second gate stack structure GST2*c* may include a second conductive pattern CP2*c* and a second dielectric pattern IP2*c*. The third gate stack structure GST3*c* may include a third conductive pattern CP3*c* and a third dielectric pattern IP3*c*.

Each of the first, second, and third gate stack structures GST1*c*, GST2*c*, and GST3*c* may include a contact dielectric pattern CIPc that surrounds the through contact TCc and a support dielectric pattern SIPc that surrounds the support structure SUSc.

The third stepwise dielectric layer SI3*c* may cover a stepwise structure of the third gate stack structure GST3*c*. At least a portion of the third stepwise dielectric layer SI3*c* may be disposed between the second gate stack structure GST2*c* and the third gate stack structure GST3*c*.

The through contact TCc may include a first through portion TC1*c* that penetrates the first gate stack structure GST1*c*, a second through portion TC2*c* that penetrates the second gate stack structure GST2*c*, and a third through portion TC3*c* that penetrates the third gate stack structure GST3*c* and the third stepwise dielectric layer SI3*c*.

A minimum width of the third through portion TC3*c* may be greater than a maximum width of the first through portion TC1*c* and a maximum width of the second through portion TC2*c*. For example, a minimum width in the second direction D2 of the third through portion TC3*c* may be greater than a maximum width in the second direction D2 of the first through portion TC1*c* and a maximum width in the second direction D2 of the second through portion TC2*c*.

The support structure SUSc may be one of support structures that is most adjacent to the through contact TCc. The support structure SUSc may include a first support portion SUS1*c* that penetrates the first gate stack structure GST1*c*, a second support portion SUS2*c* that penetrates the second gate stack structure GST2*c*, and a third support portion SUS3*c* that penetrates the third gate stack structure GST3*c* and the third stepwise dielectric layer SI3*c*.

A minimum width of the third support portion SUS3*c* may be greater than a maximum width of the first support portion SUS1*c* and a maximum width of the second support portion SUS2*c*. For example, a maximum width in the second direction D2 of the third support portion SUS3*c* may be greater than a maximum width in the second direction D2 of the first support portion SUS1*c* and a maximum width in the second direction D2 of the second support portion SUS2*c*.

In a semiconductor device and an electronic system including the same according to some embodiments, a connection contact and a through contact may have their relatively large widths, and thus the connection contact and the through contact may improve in resistance.

In a method of fabricating a semiconductor device according to some embodiments, an expansion process may be performed on a through hole and a connection hole, and therefore it may be possible to relatively reduce a time required for performing a pullback process on sacrificial layers and to prevent the through contact and the connection contact from abnormally growing caused by the pullback process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a first gate stack structure including a first dielectric pattern and a first conductive pattern that are alternately stacked with each other;

a memory channel structure including a first memory portion that penetrates the first gate stack structure;

a through contact including a first through portion at a level the same as a level of the first memory portion; and a connection contact including a first connection portion at a level the same as the level of the first memory portion and the level of the first through portion, wherein a minimum width of the first memory portion is less than a minimum width of the first through portion and a minimum width of the first connection portion.

2. The semiconductor device as claimed in claim 1, wherein a width of the first memory portion decreases as the level of the first memory portion becomes lower.

3. The semiconductor device as claimed in claim 1, wherein a difference between the minimum width of the first memory portion and the minimum width of the first through portion is in a range equal to or greater than about 80 nm.

4. The semiconductor device as claimed in claim 1, further comprising a second gate stack structure below the first gate stack structure, the second gate stack structure including a second dielectric pattern and a second conductive pattern that are alternately stacked with each other, wherein a level of each of the first memory portion, the first through portion, and the first connection portion is higher than a level of the second gate stack structure.

5. The semiconductor device as claimed in claim 4, wherein:

the memory channel structure further includes a second memory portion that penetrates the second gate stack structure, the through contact further includes a second through portion at a level the same as a level of the second memory portion, the connection contact further includes a second connection portion at a level that is the same as the level of the second memory portion and the level of the second through portion, and a minimum width of the second memory portion is less than a minimum width of the second through portion and a minimum width of the second connection portion.

6. The semiconductor device as claimed in claim 5, wherein the second memory portion and the second through portion penetrate the second gate stack structure.

7. The semiconductor device as claimed in claim 4, wherein the first dielectric pattern includes a connection dielectric pattern connected to the second gate stack structure, wherein the connection dielectric pattern includes a connection dielectric curved surface in contact with the first through portion of the through contact.

8. The semiconductor device as claimed in claim 7, wherein the connection dielectric curved surface is convex toward the through contact.

9. The semiconductor device as claimed in claim 7, wherein the first through portion includes a through curved surface in contact with the connection dielectric curved surface.

10. A semiconductor device, comprising:

a first gate stack structure including a first dielectric pattern and a first conductive pattern that are alternately stacked with each other;

a second gate stack structure below the first gate stack structure, the second gate stack structure including a second dielectric pattern and a second conductive pattern that are alternately stacked with each other;

a memory channel structure including a first memory portion that penetrates the first gate stack structure and a second memory portion that penetrates the second gate stack structure; and a through contact including a first through portion at a level the same as a level of the first memory portion and a second through portion at a level the same as a level of the second memory portion, wherein the first through portion includes a first through curved surface connected to the second through portion, and wherein a distance between facing segments of the first through curved surface increases as a level of the first through curved surface becomes lower.

11. The semiconductor device as claimed in claim 10, wherein the second through portion includes a second through curved surface connected to the first through curved surface of the first through portion, wherein a distance between facing segments of the second through curved surface increases as a level of the second through curved surface becomes lower.

12. The semiconductor device as claimed in claim 11, wherein the first through curved surface is concave, and the second through curved surface is convex.

13. The semiconductor device as claimed in claim 10, further comprising a connection contact including a first connection portion and a second connection portion, the first connection portion being at a level the same as the level of the first memory portion and the level of the first through portion, and the second connection portion being at a level the same as the level of the second memory portion and the level of the second through portion, wherein the first connection portion includes a connection curved surface connected to the second connection portion, and wherein a distance between facing segments of the connection curved surface increases as a level of the connection curved surface becomes lower.

14. The semiconductor device as claimed in claim 13, wherein a level of an uppermost portion of the memory channel structure is lower than a level of an uppermost portion of the through contact and a level of an uppermost portion of the connection contact.

15. The semiconductor device as claimed in claim 14, wherein the level of the uppermost portion of the through contact is substantially the same as the level of the uppermost portion of the connection contact.

16. The semiconductor device as claimed in claim 10, further comprising a support structure including a first support portion and a second support portion, the first support portion being at a level the same as the level of the first memory portion and the level of the first through portion, and the second support portion being at a level the same as the level of the second memory portion and the level of the second through portion.

17. The semiconductor device as claimed in claim 16, wherein the first support portion includes a support curved surface connected to the second support portion.

18. The semiconductor device as claimed in claim 16, wherein a minimum width of the first support portion is greater than a minimum width of the first memory portion.

19. An electronic system, comprising:

a main board;

a semiconductor device on the main board; and a controller on the main board and electrically connected to the semiconductor device, wherein the semiconductor device includes:

a first gate stack structure including a first dielectric pattern and a first conductive pattern that are alternately stacked with each other;

a memory channel structure including a first memory portion that penetrates the first gate stack structure;

a through contact including a first through portion at a level the same as a level of the first memory portion;

a connection contact including a first connection portion at a level the same as the level of the first memory portion and the level of the first through portion; and a support structure including a first support portion at a level the same as the level of the first through portion and the level of the first connection portion, wherein a minimum width of the first memory portion is less than a minimum width of the first through portion, a minimum width of the first connection portion, and a minimum width of the first support portion, wherein a level of an uppermost portion of the memory channel structure is lower than a level of an uppermost portion of the support structure, and wherein the level of the uppermost portion of the support structure is lower than a level of an uppermost portion of the through contact and a level of an uppermost portion of the connection contact.

20. The electronic system as claimed in claim 19, wherein the level of the uppermost portion of the through contact is substantially the same as the level of the uppermost portion of the connection contact.

* * * * *